(12) United States Patent
Nakai

(10) Patent No.: US 6,262,926 B1
(45) Date of Patent: Jul. 17, 2001

(54) NONVOLATILE SEMICONDUCTOR MEMORY DEVICE

(75) Inventor: Hiroto Nakai, Yokohama (JP)

(73) Assignee: Kabushiki Kaisha Toshiba, Kanagawa-ken (JP)

( * ) Notice: Subject to any disclaimer, the term of this patent is extended or adjusted under 35 U.S.C. 154(b) by 0 days.

(21) Appl. No.: 09/653,707

(22) Filed: Sep. 1, 2000

(30) Foreign Application Priority Data

Sep. 8, 1999 (JP) .................................................. 11-254832

(51) Int. Cl.$^7$ ....................................................... G11C 7/00
(52) U.S. Cl. ........................................... 365/200; 365/201
(58) Field of Search ..................................... 365/200, 201, 365/226, 189.09, 230.03

(56) References Cited

U.S. PATENT DOCUMENTS

| 5,563,832 | * | 10/1996 | Kagami | 365/200 |
| 5,654,925 | | 8/1997 | Koh et al. | 365/201 |
| 5,657,284 | * | 8/1997 | Beffa | 365/201 |
| 5,748,545 | * | 5/1998 | Lee et al. | 365/201 |
| 5,793,685 | * | 8/1998 | Suma | 365/201 |
| 6,034,891 | * | 3/2000 | Norman | 365/189.05 |

FOREIGN PATENT DOCUMENTS

H8-306200    11/1996   (JP) .

* cited by examiner

Primary Examiner—Son T. Dinh
(74) Attorney, Agent, or Firm—Banner & Witcoff, Ltd.

(57) ABSTRACT

A nonvolatile semiconductor memory device has a defective block detecting circuit 10 for detecting and temporarily storing a block including a defective memory cell, by detecting the potentials of a memory cell array 1, a row decoder 2, a column decoder 4, a sense amplifier circuit 3, a driving voltage generating circuit 9 for generating a driving voltage boosted in accordance with writing and erasing of data, and a signal line driven by the driving voltage generated by the driving voltage generating circuit 9. The defective block detecting circuit 10 is activated at the beginning of a test control sequence when a batch writing test is carried out every a batch erasing or writing operation every an erasing unit of the memory cell array 1, and a control circuit 7 controls the stop of the supply of the driving voltage to the defective memory cell in the test sequence on the basis of the detected output of the defective block detecting output 10. Thus, even if the defective memory cell is not replaced with a redundant cell array, a batch writing/erasing test can be carried out.

13 Claims, 19 Drawing Sheets

|  | | SGD | SELECTED CG | UNSELECTED CG | SGS | P-Well | N-Well | P-SUB-STRATE | WRITTEN BL | NON-WRITTEN BL |
|---|---|---|---|---|---|---|---|---|---|---|
| ERASE | SELECTED BLOCK | F | GND | GND | F | VPPE | VPPE | GND | F | F |
| ERASE | UNSELECTED BLOCK | F | F | F | F | VPPE | VPPE | GND | F | F |
| WRITE | SELECTED BLOCK | Vcc | VPPW | VMID | GND | GND | GND | GND | GND | Vcc |
| WRITE | UNSELECTED BLOCK | GND | GND | GND | GND | GND | GND | GND | GND | Vcc |

F : FLOATING

FIG.7

| | | SGD | SELECTED CG | UNSELECTED CG | SGS | WRITE DL | NON-WRITE DL |
|---|---|---|---|---|---|---|---|
| ERASE | SELECTED BLOCK | GND | VPPE | GND | GND | F | F |
| ERASE | UNSELECTED BLOCK | GND | GND | GND | GND | F | F |
| WRITE | SELECTED BLOCK | 8V | VPPW | 4V | GND | GND | 6V |
| WRITE | UNSELECTED BLOCK | GND | GND | GND | GND | GND | 6V |

F:FLOATING

NONVOLATILE SEMICONDUCTOR MEMORY DEVICE

RELATED APPLICATION

This application claims the benefit of priority under 35 U.S.C. § 119 of Japanese Patent Application No. H11-254832, filed on Sep. 8, 1999, the entire contents of which are incorporated by reference herein.

BACKGROUND OF THE INVENTION

1. Field of the Invention

The present invention relates generally to a nonvolatile semiconductor memory device. More specifically, the invention relates to a test technique which is effective when a chip batch writing and erasing test is carried out in an EEPROM flash memory capable of electrically erasing and writing data.

2. Description of the Related Background Art

At present, as nonvolatile semiconductor memory devices, EEPROM flash memories capable of electrically writing/erasing data are known. As memory cells of such flash memories, stacked gate type memory cells are put to practical use. Such a memory cell comprises a floating gate of a polysilicon material, which is formed on a semiconductor substrate via a tunnel oxide film having a thickness of about 9 nm, and a control gate of a polysilicon material, which is formed on the floating gate via an intergate insulating film.

As EEPROM flash memories, there have been developed NOR type EEPROM flash memories which have a plurality of memory cells connected to bit lines in parallel, AND type and DINOR type EEPROM flash memories as modifications thereof, NAND type EEPROM flash memories using a basic unit which has a plurality of memory cells connected in series. Among these memories, the NAND type flash memories are widely noticed since these memories can be high-density-integrated.

In order to test the memory cells of a NAND type flash memory for defects, a test system for batch writing and erasing all of memory cells is used. The batch writing test is a test for injecting electrons into the floating gates of all of memory cells to set a high threshold by supplying a high writing voltage VPPW to all of control gate lines and by supplying a ground (Vss) voltage to the p-type well of the cell array region. This batch writing test can be realized if a pre-decoder circuit for row addresses is formed so as to multi-select row addresses and if the circuit is formed so as to supply VPPW from all of 16 global control line voltage supply circuits in the case of 16 NANDs.

In addition, the batch erasing test is a test for extracting electrons from the floating gates of all of memory cells to set a low threshold by supplying Vss to the control gate lines of all of the memory cells and by supplying a high erasing voltage VPPE to the p-type well of the cell array. Similar to the batch writing test, the batch erasing test can be realized if a pre-decoder circuit for row addresses is formed so as to multi-select row addresses during batch erasing and if an erasing operation is carried out while all of blocks are set to be in a selected state.

However, when the above described batch writing test or batch erasing test is carried out, if a memory cell is defective, a high voltage supplied from a booster circuit leaks to cause a problem that the output voltage of the booster circuit falls. FIGS. 18A and 18B, respectively, are a sectional view and equivalent circuit diagram showing the state of defects in a NAND type memory cell. In FIGS. 18A and 18B, reference numbers (1) through (6) denote defects which may be caused in an actual producing process. Reference number (1) denotes a defective model when a bit line BL being a metal wiring and a select gate line SGD of a polysilicon material are electrically short-circuited by contaminants or the like. Reference numbers (2) and (5) denote defective models when a gate oxide film of a select gate SG is broken to electrically establish a short circuit between a select gate line SGD or SGS and a substrate. Reference number (3) denotes a defective model when a bit line BL and a control gate line CG of a polysilicon material are electrically short-circuited by contaminants or the like. Reference number (4) denotes a defective model when thin oxide films between a control gate CG and floating gate FG of a memory cell and between the floating gate FG and a substrate are broken to electrically establish a short circuit between the control gate CG and the substrate. Reference number (6) denotes a defective model when a source-side select gate line SGS and a source diffusion layer line are electrically short-circuited by contaminants or the like.

Among these defective models, the short circuit between the control gate CG and the substrate in (4) is caused if an intergate insulating film (usually, an ONO film) between the control gate CG and the floating gate FG is defective. If the ONO film of a defective cell is defective in the producing stage and if the control gate CG and floating gate FG of the memory cell have the same potential, a higher writing voltage than a withstand voltage of a tunnel oxide film of the memory cell is applied to the tunnel oxide film during the writing test, so that the tunnel oxide film of the defective memory cell is instantly broken. In addition, if the floating gate FG and the substrate are short-circuited by defects of the tunnel oxide film of a certain memory cell, a higher voltage than the withstand voltage is applied to the ONO film, so that the ONO film is instantly broken.

If such a defective memory cell exists, the boosted voltage of the control gate line leaks in the substrate to fall during the batch writing test. Therefore, the voltages of normal control gate lines, to which no defective memory cells are connected, also fall from a predetermined VPPW. In addition, during the batch erasing test, there is a problem in that the boosted voltage of the p-type well leaks in the control gate line, so that the boosted voltage VPPE falls. Also, in the case of (3) wherein the control gate line and the bit line are short-circuited, there is a problem in that the boosted voltages VPPW and VPPE fall during the batch writing and batch erasing operations, respectively.

Therefore, it is not conventionally possible to carry out the batch writing test and the batch erasing test unless the substitution of a redundant cell array for the defective memory cell is completed. FIG. 19 shows the flow of a conventional test operation until assembly after a wafer sorting test for a NAND type flash memory or the like. First, in order to find the address of a defective memory cell, a writing operation every page and an erasing operation every block are carried out (step S1). On the basis of the result thereof, the defective address of a defective memory cell is stored in each of memory chips. For example, there is often used means for storing the defective address by a fuse programming for cutting a fuse element of, e.g., a polysilicon material, by means of a laser (step S2).

Thereafter, in order to screen initial defectives out, the batch writing test and the batch erasing test are carried out predetermined times, and a writing/erasing stress is applied to the memory cell. After the stress is applied, the final writing/erasing test is carried out to select non-defectives (step S3). Then, only selected non-defectives are assembled (step S4). If the oxide film of the memory cell is deteriorated by the writing/erasing stress and if the number of defective bits increases after the batch writing/erasing test, this chip is discarded as a defective. Therefore, if the oxide film of the memory cell is greatly deteriorated by the writing/erasing test, the number of obtained non-defectives decreases, so that there is a problem in that the cost of producing chips increases. In addition, in order to prevent the chip from being discarded to decrease the yields, there is a method for cutting a fuse element at an address which is defective again. However, it is required to cut the fuse element twice by means of the laser, so that there is a problem in that the testing time and the testing costs increase.

As described above, in order to carry out the batch writing or batch erasing test with respect to conventional NAND type flash memories, it is required to prevent the applied high voltage from falling due to the defective memory cell, so that the redundant cell must be substituted for the defective memory cell. This increases the cost of producing flash memories.

The same problem is caused in EEPROMs of types other than NAND type EEPROMs.

SUMMARY OF THE INVENTION

It is therefore an object of the present invention to eliminate the aforementioned problems and to provide a nonvolatile semiconductor memory device with a test function capable of carrying out a batch writing test and a batch erasing test without substituting a redundant cell array for a defective memory cell.

In order to accomplish the aforementioned and other objects, according to one aspect of the present invention, a nonvolatile semiconductor memory device comprising:

a memory cell array, in which nonvolatile memory cells capable of being electrically rewritable are arranged;

a decode circuit for selecting a memory cell of the memory cell array;

a sense amplifier circuit for sensing read data of the memory cell array and for latching written data to the memory cell array;

a driving voltage generating circuit for generating a boosted driving voltage in accordance with write and erase modes;

a defective block detecting circuit for detecting a block including a defective memory cell of the memory cell array by detecting a potential of at least one signal line which is driven by the driving voltage generated by the driving voltage generating circuit; and a test control circuit for controlling a batch erasing test every batch erasing operation unit in the memory cell array and/or a batch writing test every writing operation unit in the memory cell array, and for stopping of the supply of the driving voltage to the defective memory cell during the batch erasing test and/or the batch writing test on the basis of the detected result of the defective block detecting circuit.

According to the present invention, a nonvolatile semiconductor memory device is equipped with a defective block detecting circuit for detecting the potential of a signal line, which is driven by a boosted writing voltage or a boosted erasing voltage, to detect and temporarily store a block including a defective memory cell of a memory cell array. In a batch writing/erasing test, the supply of a driving voltage to the defective memory cell is stopped on the basis of the output of the defective block detecting circuit. Thus, it is possible to prevent the driving voltage from falling due to the defective memory cell in the batch writing/erasing test. Therefore, it is possible to carry out the batch writing/erasing test using a normal driving voltage without substituting a redundant cell for the defective memory cell.

According to another aspect of the present invention, a nonvolatile semiconductor memory device comprising:

a memory cell array, in which nonvolatile memory cells capable of being electrically rewritable are arranged;

a decode circuit for selecting a memory cell of the memory cell array;

a sense amplifier circuit for sensing read data of the memory cell array and for latching written data to the memory cell array;

a driving voltage generating circuit for generating a boosted driving voltage in accordance with write and erase modes;

a defective block detecting circuit for detecting a block including a defective memory cell of the memory cell array by detecting a potential of at least one signal line which is driven by the driving voltage generated by the driving voltage generating circuit;

a test control circuit for storing a detected result of the defective block detecting circuit to a storing circuit of a corresponding one of blocks; and a reading out circuit for reading out the detected result from the storing circuit to an outside source.

According to a further aspect of the present invention, a nonvolatile semiconductor memory device comprising:

a memory cell array, in which nonvolatile memory cells capable of being electrically rewritable are arranged;

a decode circuit for selecting a memory cell of the memory cell array;

a sense amplifier circuit for sensing read data of the memory cell array and for latching written data to the memory cell array;

a driving voltage generating circuit for generating a boosted driving voltage in accordance with write and erase modes;

a defective block detecting circuit for detecting a block including a defective memory cell of the memory cell array by detecting a potential of at least one signal line which is driven by the driving voltage generated by the driving voltage generating circuit;

a first control circuit for storing a detected result of the defective block detecting circuit to a storing circuit of a corresponding one of blocks; and a second control circuit for storing the detected result from the storing circuit to the memory cell array.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings:

FIG. 7 is a table showing the relationship between the potentials of respective parts during the operation of the first preferred embodiment of an EEPROM according to the present invention;

DESCRIPTION OF THE PREFERRED EMBODIMENTS

Referring now to the accompanying drawings, the preferred embodiments of the present invention will be described below.

(First Preferred Embodiment)

Figure 1:
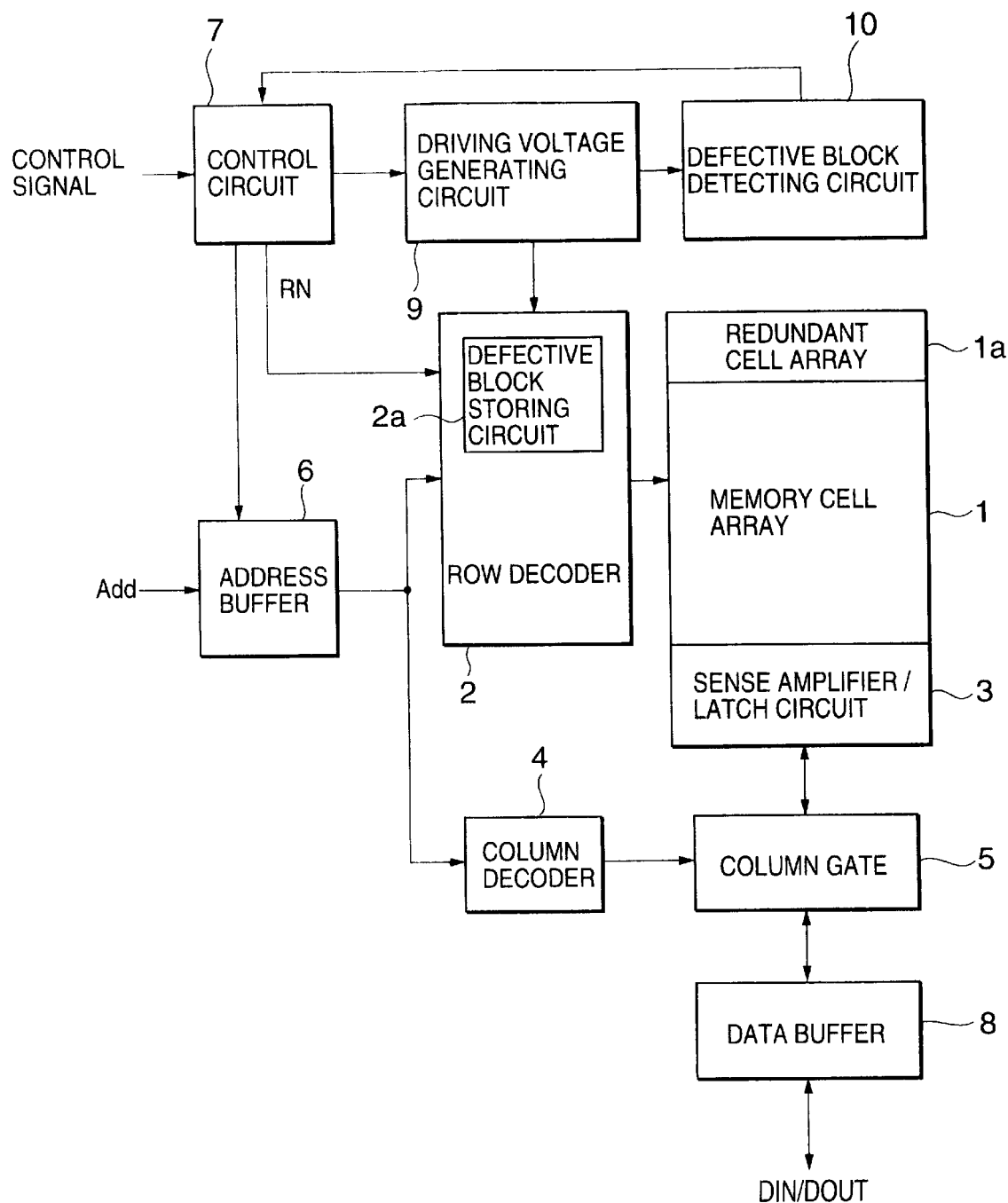
FIG. 1 is a block diagram of the first preferred embodiment of an EEPROM according to the present invention.

FIG. 1 is a block diagram of the first preferred embodiment of a NAND type EEPROM flash memory according to the present invention. As shown in the figure, this flash memory includes: a memory cell array 1; a sense amplifier circuit 3 for sensing read data of the memory cell array 1 and latching written data thereof; an address buffer 6 for receiving an address Add; a row decoder 2 and column decoder 4 for decoding the received address; a column gate 5, controlled by the output of the column decoder 4, for selecting bit line data; and a data input/output buffer 8. The row decoder 2 has a defective block storing circuit 2a.

The memory cell array 1 is provided with a redundant cell array 1a for relieving a defective memory cell. The replacement of the defective memory cell using the redundant cell array 1a is carried out by means of a defective address storing circuit provided in a peripheral circuit (not shown). Various types of defective address storing circuits have been introduced. In this preferred embodiment, the defective address storing circuit comprises, e.g., a fuse circuit, and the replacement of the defective address using the redundant cell array 1a is controlled by a programming in the fuse circuit.

A control circuit 7 is provided for controlling the writing, erasing and reading operations in the memory cell array 1. In addition, a driving voltage generating circuit 9 is provided for generating a positive high voltage and an intermediate voltage for writing and erasing operations. The generated driving voltage is fed to the row decoder 2. Moreover, in this preferred embodiment, a defective block detecting circuit 10 is provided for carrying out a batch writing/erasing operation while preventing a stress from being applied to a defective address. This defective block detecting circuit 10 is activated at the beginning of a test control sequence when a batch writing/erasing test is carried out with respect to the memory cell array. Then, the output of the defective block detecting circuit 10 is fed to the control circuit 7, so that a control signal RN for stopping the supply of a driving voltage to the defective memory cell is fed from the control circuit 7 to the defective block storing circuit 2a in the row decoder 2.

Figure 2:
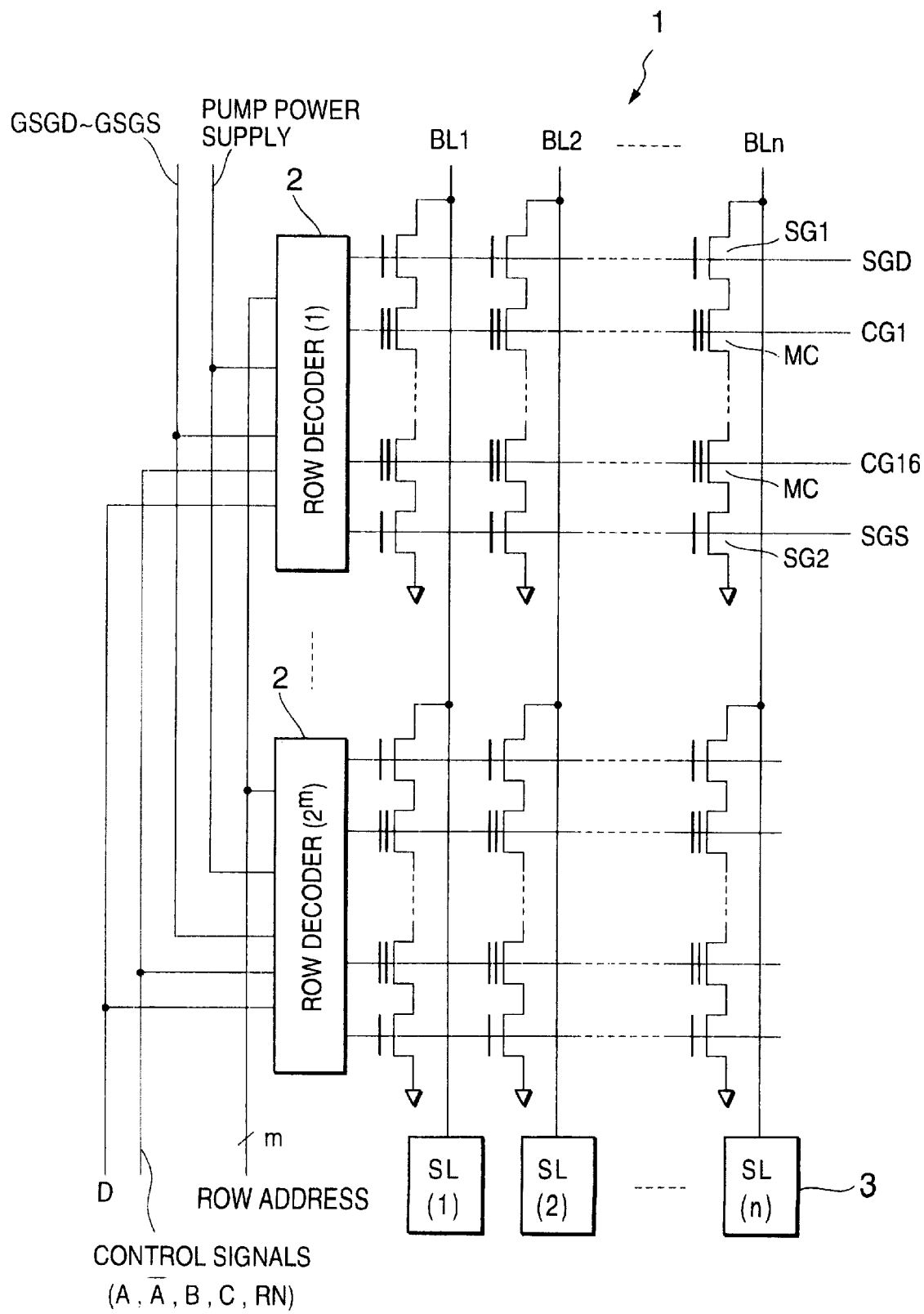
FIG. 2 is a diagram showing the construction of a memory cell array in the first preferred embodiment.

As shown in FIG. 2, in the memory cell array 1, n bit lines BL are arranged so as to extend in row directions, and $2^m$ NAND bundles corresponding to an m-bit address are arranged so as to extend in column directions. Each of NAND bundles comprises 16 memory cells MC connected in series, and select gate transistors SG1 and SG2 provided on both sides thereof. That is, one end of a current passage of each of the NAND bundles is connected to a corresponding one of the bit line BL via the select gate transistor SG1, and the other end thereof is connected to a common source line via the select gate transistor SG2.

The respective control gates and two select gate transistors included in m NAND cell units arranged so as to extend in row directions are connected to control gate lines (i.e., word lines) CG1 through CG16 and select gate lines SGD and SGS. Each of the $2^m$ NAND cell units arranged so as to extend in row directions constitutes a minimum unit for erase, and is generally called an erase block. The plurality of control gate lines and select gate lines included in one erase block are driven by a corresponding one of the row decoders 2. To the $2^m$ row decoders 2, a m-bit row address signal, a pump power supply for supplying a power supply to a booster circuit included in each of the row decoders 2, global select gate lines GSGD and GSGS, global control gate lines GCG1 through GCG16, row decoder control signal lines A, /A, B, C and RN, an erase block retrieving signal line D are inputted.

In FIG. 2, $2^m$ row decoders 2 and $2^m$ erase blocks driven by the respective row decoders 2 are shown so as to correspond a m-bit row main address. Moreover, each of the bit lines is connected to a sense amplifier/latch circuit (SL) 3 for reading the potential of a corresponding one of the bit lines.

Each of the row decoders 2 includes row main decoder 22 (FIG. 5) for receiving a row address to select a block of the memory cell array 1, and row sub-decoder 23 (FIG. 6) for transferring a boosted driving voltage, which is generated by the driving voltage generating circuit 9, to the control gate lines and selecting gate lines of the block which is selected by the row main decoder 22. Therefore, each of the row main decoders 22 and each of the row sub-decoders 23 correspond to each one of the blocks.

Figure 3:
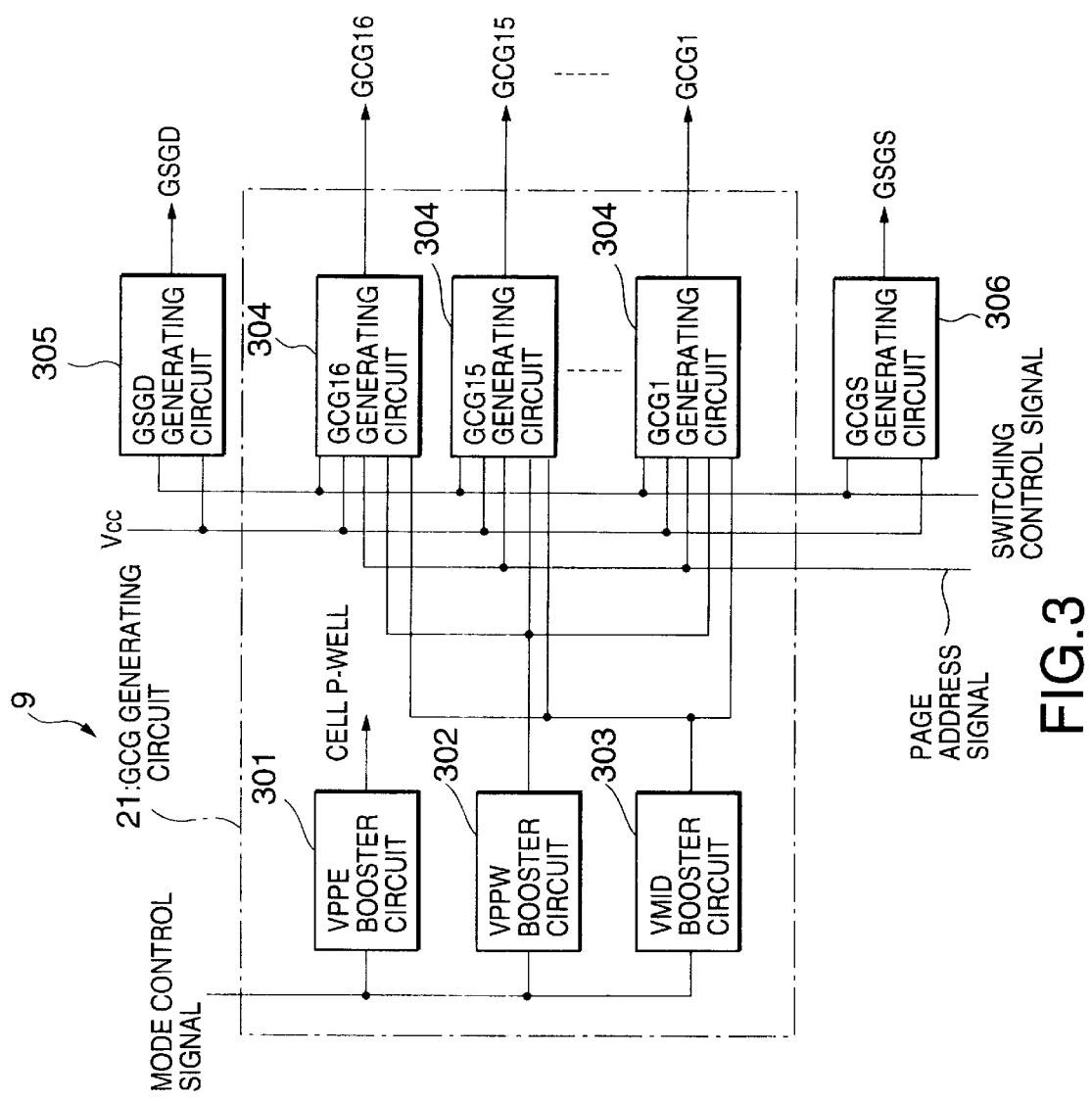
FIG. 3 is a block diagram of a global control gate line potential generating circuit in a row decoder in the first preferred embodiment.

The driving voltage generating circuit 9 has a global control gate line voltage generating circuit (a GCG generating circuit) 21 as shown in FIG. 3. The GCG generating circuit 21 includes a VPPE booster circuit 301 for generating an erasing high voltage VPPE, a VPPW booster circuit 302 for generating a writing high voltage VPPW, and a VMID booster circuit 303 for generating an intermediate voltage VMID which is given to an unselected control gate line in one block during a writing operation. The outputs of the booster circuits 302 and 303 are selected by a switching control signal and a page address signal in a voltage generating circuit 304, to be give to the global control gate lines GCG1 through GCG16. The power supply voltage is supplied to the global select gate lines GSGD and GSGS by a switching control signal.

Figure 5:
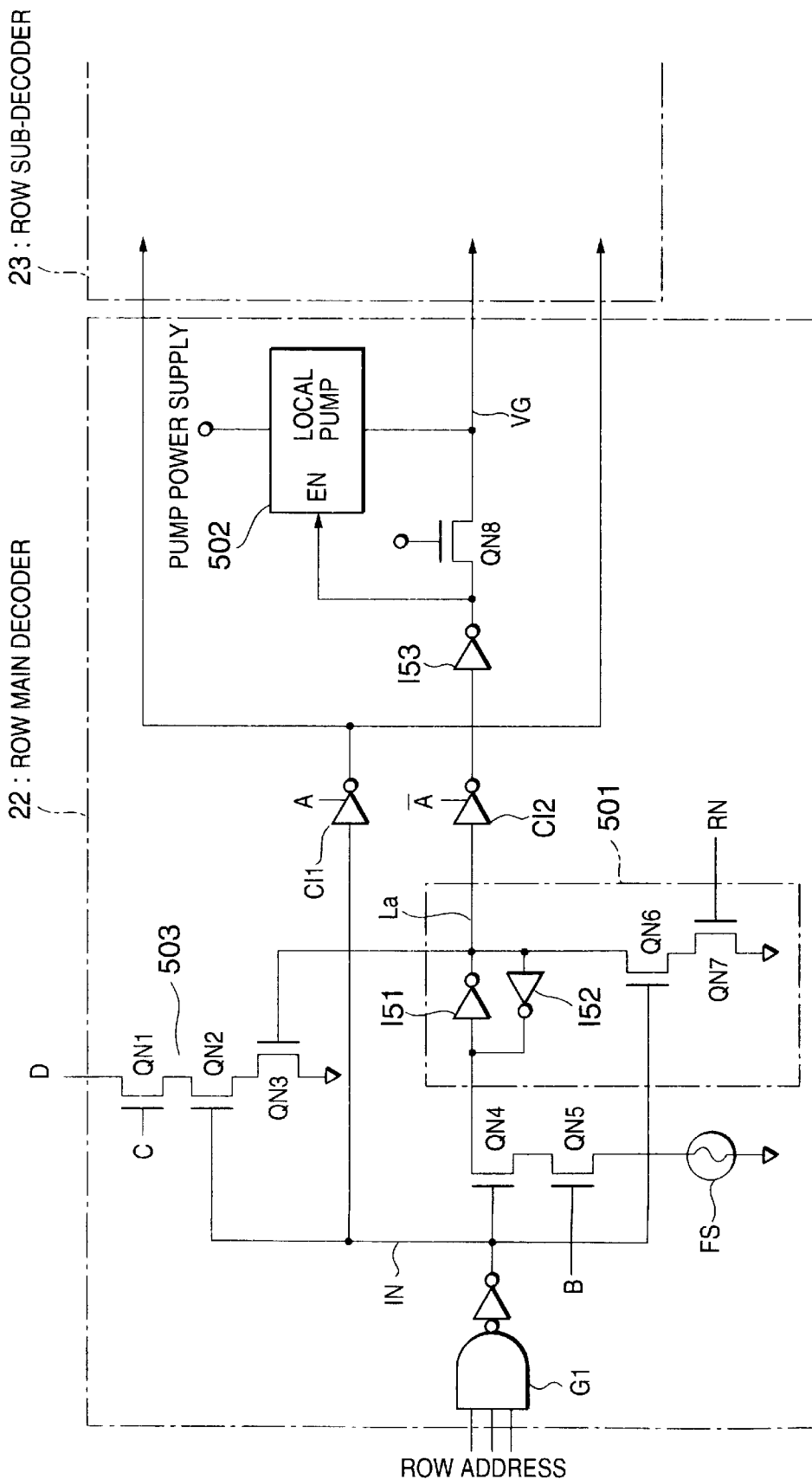
FIG. 5 is a diagram showing the construction of a row main decoder in the row decoder.
Figure 6:
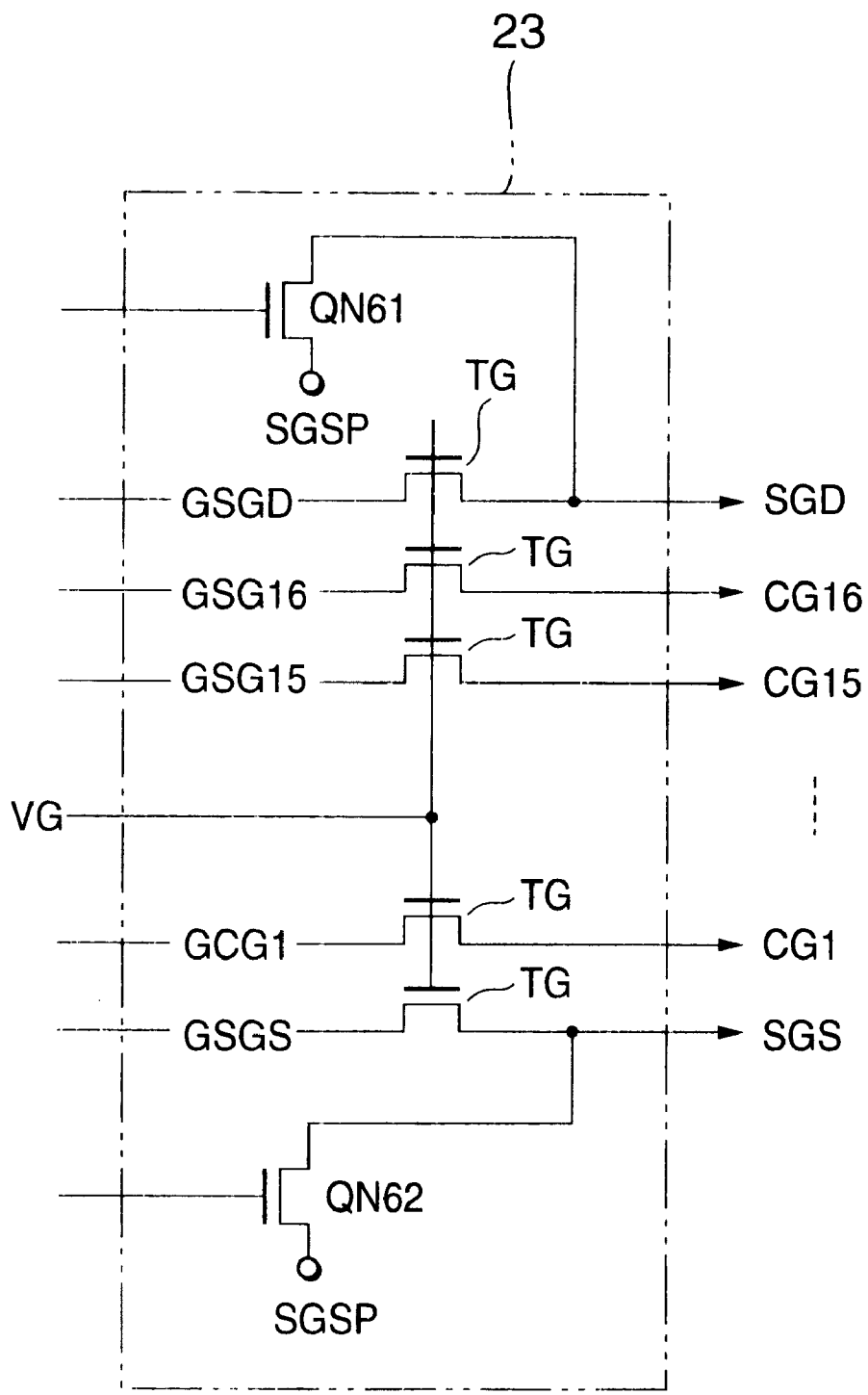
FIG. 6 is a circuit diagram showing the construction of a row sub-decoder in the row decoder.

As shown in FIG. 5 and FIG. 6, the row main decoders 22 are a part for selecting the select gate lines SGD and SGS and control gate line CGi of one block in accordance with a row address signal. During a reading/writing/erasing operation, the potential of a node VG corresponding to a selected block address is in a high level. To the contrary, the potential of the node VG corresponding to an unselected block address is in a low level. The supply voltage is controlled by a local pump 502 so that the potential of the node VG of the selected address is VPPW+Vth (the threshold of the NMOS transistor) during a writing operation and Vcc+Vth during reading and erasing operations. As the power supply for the local pump 502, VPPW is supplied during the writing operation, and Vcc is supplied during the reading and erasing operations.

As shown in FIG. 5, in the row main decoder 22, a NAND gate G1 for receiving a row address signal constitutes an input stage circuit. The inverted output of the NAND gate G1 is connected to the gates of NMOS transistors QN4 and QN6, a clocked inverter CI1, and the gate of an NMOS transistor QN2. One end of the NMOS transistor QN4 is connected to a fuse element FS via an NMOS transistor QN5, and the other end thereof is connected to an input part of a latch circuit 501 having inverters I51 and I52 which are inversely connected in parallel. The output node La of the latch circuit 501 is connected to the Vss via the NMOS transistor QN6, the gate of which is connected to an input node IN, and via an NMOS transistor QN7 for resetting latched stored data. An aggregation of the plurality of latch circuits 501 constitutes the defective block storing circuit 2a in the FIG. 1.

The decode output terminal IN and the output terminal La of the latch circuit 501 are connected respectively to the input terminals of the clocked inverters CI1 and CI2 which are complementarily driven by the signals A and /A. The outputs of these clocked inverters CI1 and CI2 are commonly connected, and the outputs thereof are fed to the row sub-decoder 23. The outputs of the clocked inverters CI1 and CI2 also serve as enable signals, which are supplied to the local pump circuit 502 via an inverter I53, and are supplied to the node VG. The voltage of the node VG is a control voltage for controlling a driving voltage transfer gate in the row sub-decoder 23.

The serially connected NMOS transistors QN1, QN2 and QN3 of the row main decoder 22 constitutes an erase selecting address retrieving circuit 503 for retrieving an block address which is in erase-selected state during a verify readout in an erase mode. The gate of the NMOS transistor QN3 is connected to the output a node La of the latch circuit 501, and the gate of the NMOS transistor QN2 is connected to the decode output terminal IN. The output node La of the latch circuit 501 corresponding to a block, in which data erasing information has been stored, is also in "H". If the corresponding address is inputted an address corresponding to the block, the output node IN of the block is in "H", so that both of the NODS transistors QN2 and QN3 are turned on. This state can be detected by turning on the transistor QN1 which is controlled by a signal C, and the control circuit 7 can retrieve the address, which has been selected as the erase state, by the change of a terminal D.

As shown in FIG. 6, the row sub-decoder 23 includes NMOS transfer gate transistors TG for connecting the global select gate lines GSGD and GSGS and the global control gate lines GCG1 through GCG16 to the corresponding select gate lines SGD and SGS and control gate lines CG1 through CG16 of the memory cell array 1. The transfer gate transistors TG are controlled by the output node VG of the local pump circuit 502 of the row main decoder 22. In addition, in order to supply a predetermined potential from a signal line SGSP to the select gate lines SGD and SGS during a writing operation or a reading operation, NMOS transistors QN61 and QN62 controlled by the row main decoder 22 are connected to the select gate lines SGD and SGS, respectively.

As shown in FIG. 5, in this preferred embodiment, in the row main decoder 22, the NMOS transistor QN6 controlled by the decode output node IN is provided between the output node La of the latch circuit 501 and the resetting NMOS transistor QN7. Then, the control signal RN, which is generated by the control circuit 7 on the basis of the output of the defective block detecting circuit 10, enters the gate of the resetting transistor QN7.

Figure 4:
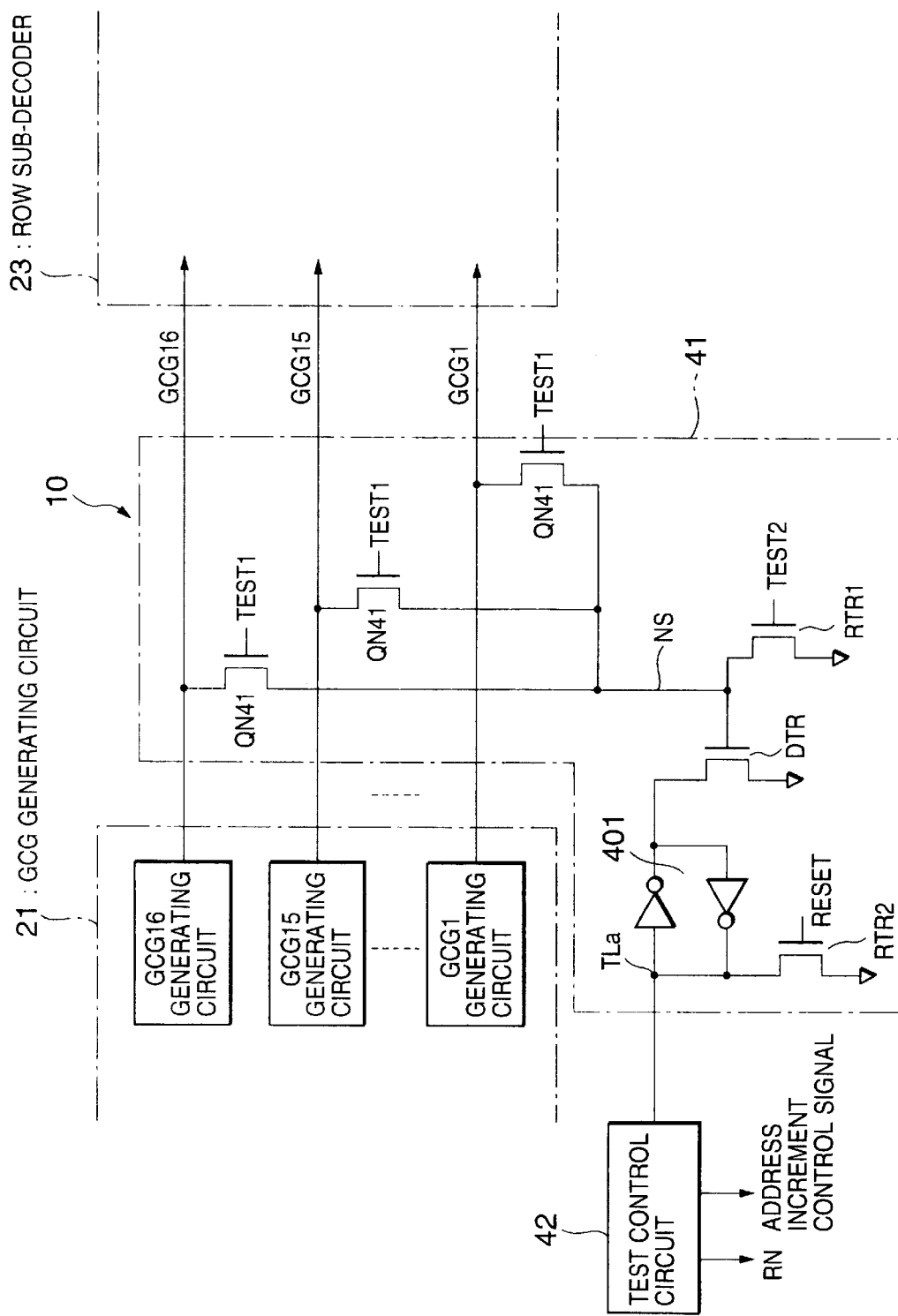
FIG. 4 is a diagram showing the construction of a global control gate line potential detecting circuit in the row decoder.

In addition, according to the present invention, a defective address for decreasing the output potential of the booster circuit is automatically detected during the batch writing/erasing test mode, and the defective address is stored in the storage circuit so as not to apply a high voltage stress to that address, so that the batch writing/erasing test with respect to the memory cells is carried out before using the redundant circuit. In order to achieve this, the defective block detecting circuit 10 is provided. In this preferred embodiment, as shown in FIG. 4, the defective block detecting circuit 10 comprises a global control gate line potential detecting circuit 41 for detecting the variation in potential of the global control gate lines GCG1 through GCG16 between the GCG voltage generating circuit 21 and the row sub-decoders 23.

The potential detecting circuit 41 has transfer gate NMOS transistors QN41, one ends of which are connected to the global control gate lines GCG1 through GCG16 respectively, and the other ends of which are connected commonly to a sense node NS. The transfer gate NMOS transistors QN41 are driven by a test signal Test1. The sense node NS is connected to the gate of a sensing NMOS transistor DTR. The source of the sensing NMOS transistor DTR is grounded, and the drain thereof is connected to a latch circuit 401 for holding the sensed result. The sense node NS is also connected to a resetting NMOS transistor RTR1 which is driven by a test signal Test2 for resetting the node NS. The output node TLa of the latch circuit 401 is also connected to a resetting NMOS transistor RTR2 which is driven by a reset signal Reset.

Although the details of the potential detecting circuit 41 will be described later, the potential detecting circuit 41 is designed to detect the potentials of the global control gate lines GCG1 through GCG16 by a defective address retrieving operation at the beginning of the batch erasing/writing test. If the sense node NS=H due to the defective address, the sensing NMOS transistor DTR is turned on, so that the output node TLa of the latch circuit 401 is held to be in "H". By this latch data, a test control circuit 42 (included in the control circuit of FIG. 1) is controlled. The test control circuit 42 is designed to output an address increment control signal and to supply a reset control signal RN to the latch circuit 501 of the row main decoder 22 in response to the latch data TLa=H. Thus, during the batch erasing or batch writing operation, no driving voltage is supplied to a defective control gate line.

The operation of the EEPROM in this preferred embodiment will be described below. Before the description of batch erasing and batch writing operations, usual writing and erasing operations will be described. FIG. 7 shows the relationship between the potentials of respective parts during writing and erasing operations.

During an erasing operation, all of the control gate lines CG in a selected erase block are set at the Vss potential (GND). At this time, an erasing voltage VPPE of about 20 V is supplied to the p-type well, on which the memory cells are formed. At a result, electrons in the floating gates of the memory cells are emitted to the p-type well, so that the thresholds of the memory cells fall. The thresholds of all of the memory cells included in the selected block are changed so as to have a negative value to provide an erase state.

During this erasing operation, the potential of the p-type silicon substrate is set to be the Vss potential, and the erasing voltage VPPE is supplied to the n-type well including the p-type well. In addition, all of the bit lines BL and select gate lines SGD and SGS are set to be in a floating state so as not to apply a high voltage stress. Moreover, all of the control gate lines CG in the unselected erase block are set to be in the floating state. Therefore, when the p-type well is charged to the VPPE, the potential of the control gate line CG rises to approximately the potential of the VPPE by the coupling of the channel to the control gate in the unselected block. As a result, a great electric field is not produced in the tunnel oxide films of the memory cells in the unselected block, so that the thresholds of the memory cells in the unselected block do not vary.

During a writing operation, a high writing voltage VPPW is supplied to a control gate line CG of a selected page address in a selected block. At this time, an intermediate voltage VMID between the VPPW and the Vss is supplied to the unselected control gate lines of the same block, and the p-type well, the n-type well and the substrate are grounded. The power supply voltage Vcc is supplied to the drain-side select gate lines SGD of the selected block, and the source-side select gate lines SGS are grounded. By supplying 0 V to the bit lines BL during the writing operation, it is possible to produce a high voltage field between the control gates and channels of the memory cells of the selected page address to raise the thresholds of the memory cells. In addition, by supplying the power supply voltage Vcc to the bit lines, the drain-side select gate transistor SG1 of the selected block is cut off, and the channel potential in the selected NAND unit is raised by the coupling to the unselected control gate line. As a result, no high electric field is produced between the control gates and channels of the memory cells of the selected page address, and the thresholds of the memory cells do not vary. Thus, by selecting the supply of the Vss or Vcc to the bit lines BL, desired data are batch-written in all of the memory cells in the selected page. In addition, all of the control gate lines and select gate lines in the unselected block are grounded.

The operation of the row decoder 2 in the above described writing operation is as follows. As shown in FIG. 5, since all row address signals corresponding to a selected block are in a high level, the decode output IN of one of the row main decoders 22, which corresponds to a selected block, is in a high level. At this time, since the clock signal A is set to be in a high level and the clock signal /A is set to be in a low level, the clocked inverter CI1 is enable, and the clocked inverter CI2 is disable. Therefore, regardless of the contents of the latch circuit 501, the low level which is an inverted level of the decode output IN is supplied to the input terminal of the inverter I53, and simultaneously, this level is supplied to the high voltage resistant transistors QN61 and QN62 of the row sub-decoder 23.

Since the output signal of the inverter I53 is in a high level, an NMOS transistor QN8 is cut off, and the output VPPW+Vth of the local pump circuit 502 is given to the node VG. Thus, in the row sub-decoder 23, the transfer gate TG is turned on. Since the Vcc and Vss voltages are supplied to the global select gate lines GSGD and GSGS, respectively, the Vcc and Vss are supplied to the select gate lines SGD and SGS of the selected block of the memory cell array via the transfer gate TG, respectively.

In addition, the writing voltage VPPW is supplied to a global control line GCG corresponding to the selected page address, and the intermediate voltage VMID is supplied to the remaining global control lines GCG. As a result, the writing voltage VPPW is supplied to the control gate line of the selected page address in the selected block, and the intermediate voltage VMID is supplied to the control gate lines of other page addresses. In the unselected block, since the decode output terminal is in a low level, the local pump circuit 502 is disable, and the inverter I53 supplies a low level to the gate of the transfer gate TG of the row decoder 23. In addition, in the row sub-decoder 23, the NMOS transistors QN61 and QN62 are in a conducting state, so that the Vss level supplied to the signal line SGSP is supplied to the drain-side and source-side select gate lines SGD and SGS. As a result, the control gate line of the unselected block is in a floating state, so that the select gate line is in the Vss level which is an unselected level. Thus, no writing voltage is supplied to the gates and channel portions of the memory cells in the unselected block, so that the thresholds of the memory cells do not vary.

The operation of the row decoder 2 during a block erasing operation will be described below. During an erasing operation, with respect to a block which is intended to be erased, a high level is latched by the latch circuit 501 of the main row decoder 22, and thereafter, erasing operations are simultaneously carried out with respect to the memory cells included in all of a plurality of selected blocks. After the erasing operations, a verify readout is carried out every block to examine whether all of the memory cells in the block are normally erased. If a block or blocks are not normally erased, the block(s) are erased again. When a high level is latched by the latch circuit 501 of the erase block, the gate signal B of the NMOS transistor QN5 is in a high level. If the selected block is not defective, the fuse element of a polysilicon has not been cut by the laser, and the output terminal IN of the selected terminal is in a high level, so that the high level is latched by the terminal La of the latch circuit 501.

When a plurality of blocks are selected, the latch circuits 501 of the plurality of selected blocks can store a high level by setting the signal B to be in the high level to switch the row address. If the selected block is a defective block and if the fuse element FS of a polysilicon is cut by the laser, the high level is not latched by the latch circuit 501. In this case, the redundant block is usually selected, and the high level is stored in the latch circuit.

After the high level is stored in all of the latch circuits 501 in the block which is intended to be erased, all of the memory cells included in the block are batch-erased. At this time, the clock signal /A is in a high level, and the high level stored in the latch circuit 501 is outputted as a low level via the clocked inverter CI2. At this time, the high level supplied from the local pump circuit 502 is set to be the power supply Vcc level. Since the output of the clocked inverter CI2 is in the low level, the NMOS transistors QN61 and QN62 in the row decoder 23 are in a non-conducting state. During the erasing operation, all of the global control lines are in the Vss level, and the erasing voltage VPPE is supplied to the p-type well, on which the memory cells are formed.

In the selected block, since the Vss level in the global control lines is supplied directly to 16 control gate lines, a high electric field is formed between the control gates of the memory cells and the p-type well, so that electrons in the floating gates of the memory cells are emitted to the p-type well. At this time, since the power supply voltage Vcc is supplied to the global select gate lines GSGD and GSGS, the select gate transistors are in a non-conducting state, so that the selecting gate lines SGD and SGS are in the floating state. Since the potential of the p-type well of the selected block rises gradually to the VPPE, the potentials of the select gate lines SGD and SGS also rise approximately to the VPPE by the coupling. Therefore, no high voltage stress is applied to the select gate transistors.

In addition, in the block wherein the low level has been stored in the latch circuit 501, the transfer gate line voltage is the Vss, and the control gate lines are set to be in the floating state. Moreover, although the NMOS transistors QN61 and QN62 of the unselected block have a gate potential of Vcc, the potential of the internal signal line SGSP is set to be the power supply voltage Vcc during the erasing operation. Therefore, the NMOS transistors QN61 and QN62 are in a non-conducting state, and the select gate lines SGD and SGS are in a floating state. Thus, since all of the selecting gate lines and control gate lines in the unselected block are in the floating state, the potentials of the gate lines rise approximately to the VPPE by the coupling to the p-type well. As a result, the thresholds of the memory cells in the unselected block do not vary.

After the above described erasing operation, a verify readout is carried out every selected erase block in order to check whether the memory cells in the erased block have been correctly erased. In order to shorten the erasing time, it is checked whether the high level has been stored in the latch circuit 501 of each of the blocks, and the verify readout is carried out only with respect to the block, in which the high level has been stored. Therefore, the high level is given to the signal line D connected commonly to all of the latch circuits 501, so that the level of the signal C is varied to a high level. In this state, the control circuit sequentially increments the address. If the high level is stored in the latch circuit 501 of the selected block, all of the NMOS transistors QN1 through QN3 in the selected block are turned on, so that the level of the signal line D falls. In response to this variation in the signal line D, the control circuit on the chip generates a control signal so as to carry out the verify readout with respect to the selected block. If the low level has been stored in the latch circuit 501 of the selected block, the level of the signal line D does not fall, so that the sequence is controlled so as not to carry out the verify readout with respect to the selected block.

A batch writing/erasing operation of the EEPROM in this preferred embodiment will be described below. First, at the beginning of a control sequence for carrying out a batch writing/erasing operation, an operation for detecting a block including a defective memory cell is automatically carried out in the chip by means of the detecting circuit 41 shown in FIG. 4. Although this operation will be described using the timing chart for principal signals shown in FIG. 8, the detailed description of the test control circuit 42 for realizing such an operation is omitted since it can be easily realized by a usual sequencer design technique.

Figure 8:
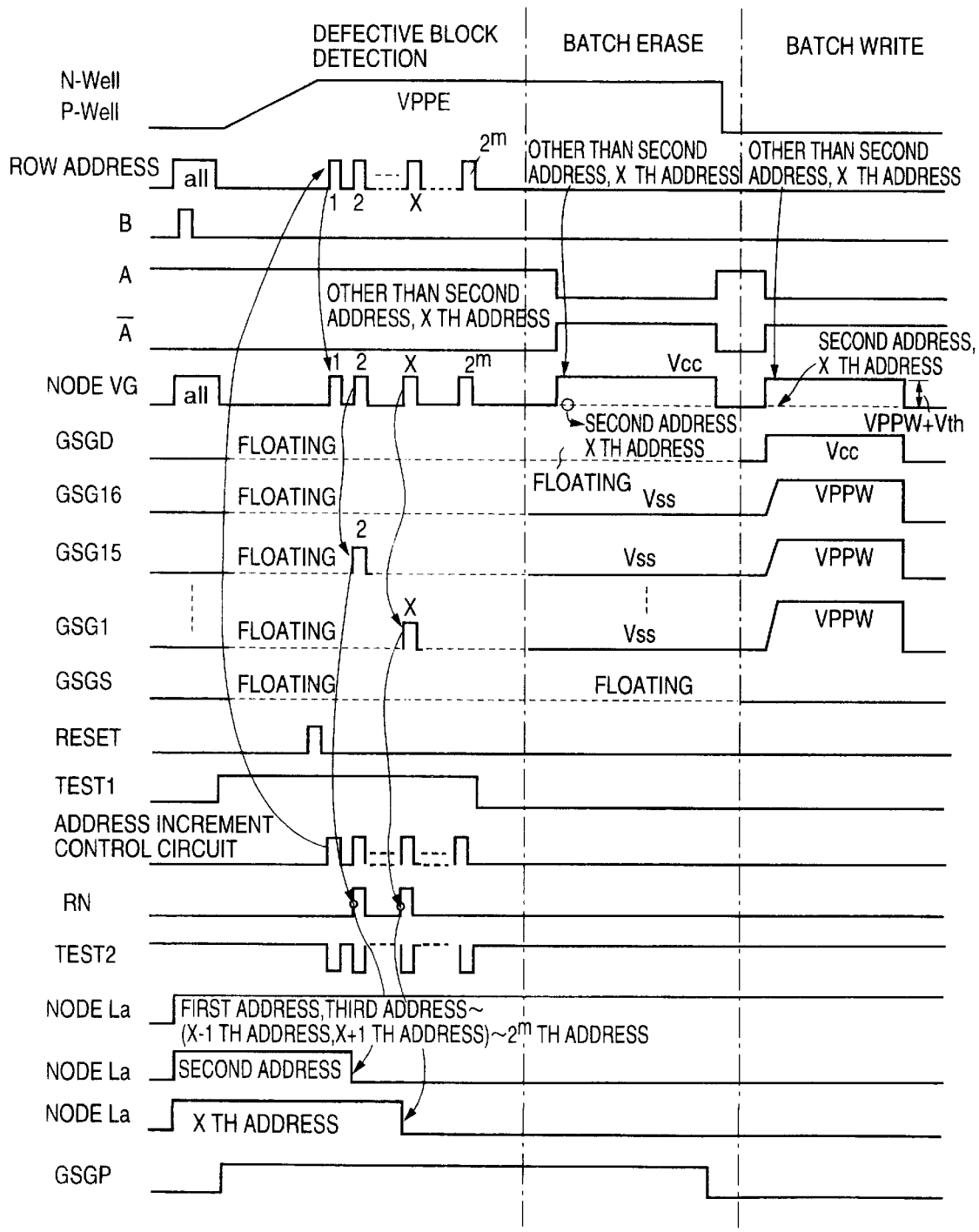
FIG. 8 is a timing chart for explaining a batch writing/ erasing operation in the first preferred embodiment.
Figure 9:
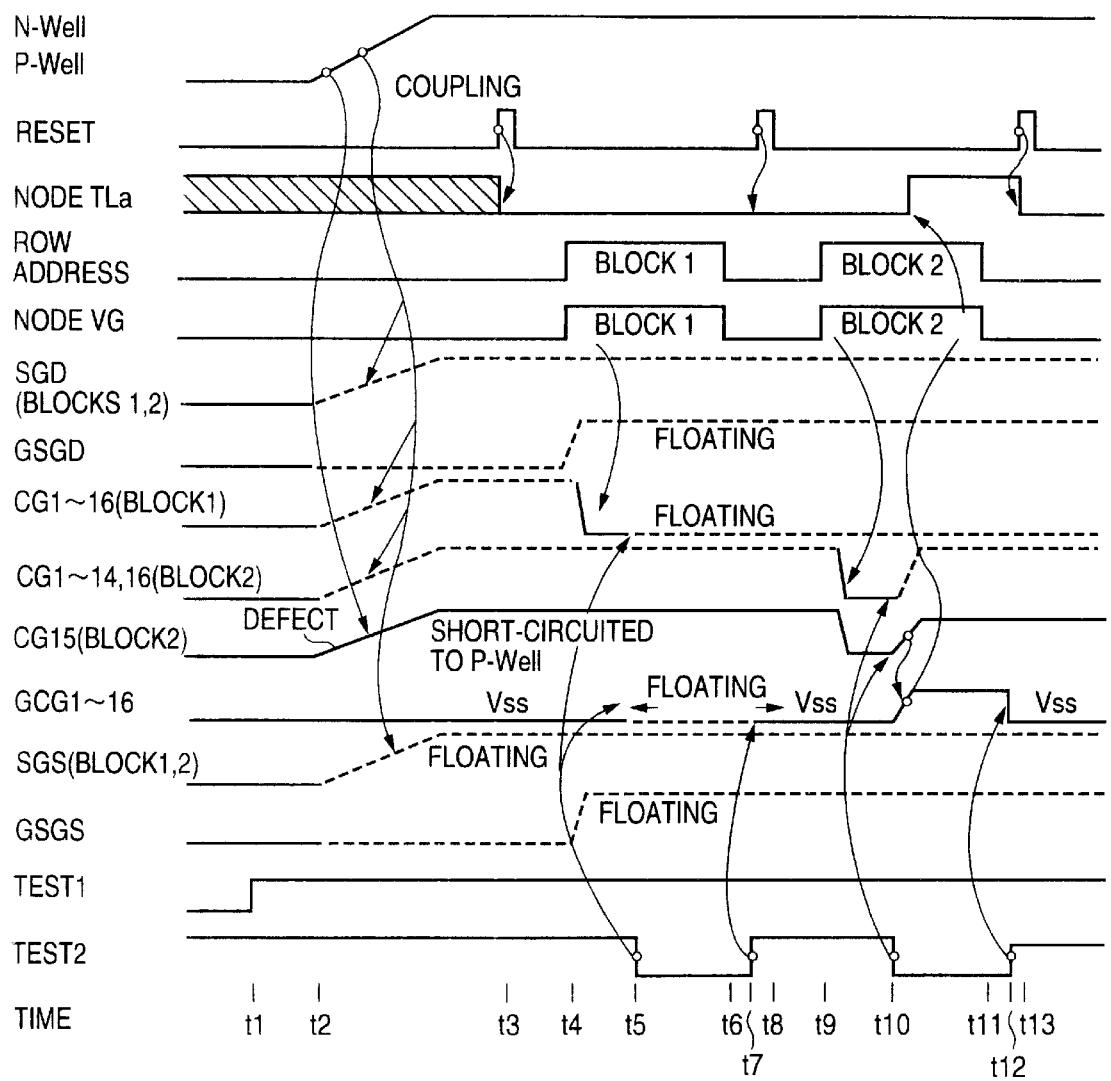
FIG. 9 is a timing chart showing a part of FIG. 8, which is shown by enlarging a time base.

FIG. 8 shows an example of a case where defective memory cells exist in the blocks of the second address and the Xth address, and FIG. 9 is a timing chart for principal signals when the initial part of the defective block detecting operation of FIG. 8 is enlarged with respect to the time base to be shown in detail. In particular, FIG. 9 shows an example of a case where one of memory cells connected to the control gate line CG15 in the block of the second address is defective.

First, the potentials of all of control lines in a floating state are reset to be 0 V. Therefore, the test control circuit 42 controls the row decoder so that all of row addresses are in a selected state and so that all of the global control lines GCG1 through GCG16 output 0 V. At this time, the signal A is in a high state, and when the row address is in a full selection state, the nodes VG of all of the row main decoders 22 have a high level, so that 0 V of the global control lines GCG1 through GCG16 is transmitted to the control gate lines CG1 through CG16.

In addition, by giving a short pulse-shaped positive logical signal to the signal B, all of the output nodes La of the latch circuits 501 in the row main decoder 22 are set to be in a high level. In the batch writing/erasing test carried out before the fuse programming, the fuse element in the row main decoder 22 has not yet been cut by the laser, so that the levels of the output nodes La of all of the latch circuits 501 (the first address through $2^m$ th address) in the row main decoder 22 are set to be high.

Then, the test signal Test1 is set in a high level to detect a block including a defective memory cell, a high erasing voltage VPPE is given to the p-type well in the substrate, on which the memory cells are formed, and to the n-type well including the p-type well. Since this operation is the same as the sequence which is carried out during the usual data erasing operation, the detailed description thereof is omitted. If the test signal Test1 has H, the potential detecting circuit 41 shown in FIG. 4 is in an active state (i.e., the transistor QN41 is in an on state). At this time, all of the global control gate lines GCG1 through GCG16 and global select gate lines GSGD and GSGS are in a floating state. As shown in FIG. 9, if an erasing voltage VPPE is applied to the p-type well, in which the channel portions of memory cells are formed, at time t2, a control gate voltage is raised by the capacitive coupling between the channel portions and control gates of the memory cells.

FIG. 9 shows the state that the potentials of the control gate lines CG1 through CG16 of a block 1 and the potentials of the control gate lines CG1 through CG14 and CG16 of a block 2 are substantially equal to the VPPE by the coupling. In addition, the potential of the control gate line CG15 of the block 2, in which the control gates and the substrate are electrically short-circuited, becomes the VPPE as a result of the electric short-circuit. Since the global select gate lines GSGD and GSGS are set so as to have the Vcc, the select gate lines SGD and SGS are in a floating state similar to the erasing state, and the select gate lines SGD and SGS are substantially equal to the VPPE by the coupling of the channel portion to select gate line of the select gate transistor.

If the reset signal Reset is a positive logic at time t3 for a predetermined period of time, the reset transistor RTR2 of the detecting circuit 41 shown in FIG. 4 is a conducting state. Therefore, the level of the node TLa is reset to be a low level. Then, at time t4, the test control circuit 42 generates an address increment control signal which raises an address signal for selecting a block 1, so that the row address of the first block is in a selected state. Therefore, the node VG in the row main decoder 22 of the first block is in a high level, so that all of the transfer gate transistors TG of the row decoder 23 of the first address are in a conductive state.

Since the global control gate line GCG is grounded to the Vss potential up to time t5, the potential of the control gate line CG raised by the coupling of the memory cell falls to the Vss when the transfer gate transistors TG are in the conducting state. In addition, since the global select gate lines GSGD and GSGS are in a floating state, these lines are varied by the movement of the charges of the select gate lines SGD and SGS. At time t6, all of the row decoders are in an unselected state, and the first block is also returned to the unselected state. Therefore, the potential of the node VG falls to the low level.

Between time t5 and time t7, a negative logical pulse is outputted to the test signal Test2, and the reset transistor RTR1 is in a non-conducting state. Moreover, the transistor QN41, the gate of which receives the test signal Test1, is in a conducting state. Therefore, the gate potential of the sensing NMOS transistor DTR in the global control line potential detecting circuit 41 is determined by the global control line potential. If at least one of 16 global control lines GCG1 through GCG16 is in a high level, the transistor DTR is turned on. In the example of FIG. 9, since no defective memory cell is connected to the control gate line CG of the block of the first address, the global control gate lines GCG1 through GCG16 have a low level, so that the sensing NMOS transistor is not in a conducting state. Therefore, the node TLa remains being in the low level in the reset state.

In addition, the test control circuit 42 supplies the same logical level signal RN as that in the node TLa, to the gate of the transistor QN7 of the latch circuit 501 in the row main decoder 22 between time t5 and time t7. As shown in FIG. 9, since the level of the node TLa is the low level between time t5 and t7, the node La remains being in the high level even if the transistor QN7 is in a conducting state between time t4 and time t6, in which the block 1 of the first address is in the selected state. Thus, the operating for checking whether any defective cells exist in the block 1 of the first address is completed.

Then, the block 2 of the second address is checked by the test control circuit 42. At time t8, the reset signal Reset is a positive logic again for a predetermined time, and the node TLa is reset at the low level. In addition, the global control gate line is released from the floating state to be grounded to the Vss. At time t9, the second row address is in the selected state. As a result, the node VG in the row decoder of the block 2 is in a high level, and all of the transfer gate transistors TG in the second row sub-decoder 23 are in a conducting state. Thus, the levels of the control gate lines CG1 through CG16 of the block 2 fall to the Vss level.

At this time, the control gate CG15 has a defective oxide film, and is electrically short-circuited to the p-type well in the substrate. However, since the resistance due to break is high, the potential of the global control gate line GCG 15 is substantially equal to the Vss potential. Thereafter, if a negative logical test signal Test2 is outputted between time t10 and t12, the reset transistor RTR1 is in a non-conducting state, and each of the global control lines is in a floating state. However, since the control gate line CG15 of the block of the second address is connected to the defective memory cell, the potentials of the control gate line CG15 and global control gate line GCG15 of the page address 15 gradually rise to the same potential as the VPPE.

As a result, the potentials of the remaining control gate lines and global control gate lines rise via the transistor QN41 of the global control line potential detecting circuit 41 to be substantially equal to the VPPE. At this time, since the sense transistor DTR is a conductive state, the level of the input node of the latch circuit 401 in the global control line potential detecting circuit 41 varies to the low level, and the high level is latched in the node TLa. The test control circuit 42 supplies a high level signal RN, which has the same logical level as that in the node TLa, to the gate of the transistor QN7 of the latch circuit 501 in the row main decoder 22 corresponding to a selected block. Therefore, while the block 2 of the second address is selected to allow the transistor QN7 to be in a conducting state, the level of the output node La of the latch circuit 501 corresponding to the block 2 of the second address is set to be the low level. This information is stored in the latch circuit 501 until the subsequent batch writing/erasing test is finished.

At time t11, all of the row addresses are in the unselected state. Then, at time t12, the global control line is grounded to the VSS level again by means of the resetting transistor RTR1. Thus, the operation for checking whether the defective cell exists in the block 2 specified by the second block address is completed. Then, at time t13, the output signal of the latch circuit 401 of the global control line potential detecting circuit 41 is reset by the reset signal Reset. Thereafter, all of the blocks on or after the third block address are similarly checked. With respect to the blocks on or after the third block, FIG. 8 shows a case where the defective memory cell is connected to the page address 1 (the control gate CG1) of a block being the Xth block address.

Thus, after the checking operation up to the final block address $2^m$ is completed, the level of the test signal Test1 varies to the low level, and the defective block detection and the latch period of time are completed. Thereafter, the batch erasing operation is continuously carried out. Therefore, the mode is automatically switched in the control circuit in the chip so that the level of the signal A varies to the low level and the level of the signal /A varies to the high level. Thus, the level of the node VG in each of the row sub-decoders 22 is the same level as the level of the node La of each of the latch circuits 501.

In the example of FIG. 8, "0" data (L) are latched in the latch circuit 501 of the row main decoder 22 corresponding to the second block address and the Xth block address, and "1" data (H) are latched in the latch circuits 501 of the row main decoders 22 of other block addresses. Therefore, during the batch erasing operation, VG=L is given to the gates of all of the transfer gate transistors TG in the row sub-decoder 23 corresponding to the second block address and the Xth block address, so that all of the transfer gate transistors TG therein are in a non-conducting state. All of the transfer gate transistors TG in the row sub-decoder 23 corresponding to other block addresses are in the conducting state by VG=H. During the batch erasing operation, since all of the global control gate lines have a potential of Vss, all of the control gates of the second block address and the Xth block address are in the floating state, and all of the control gates of other block addresses have the Vss potential.

As described above, according to this preferred embodiment, the control gate of the block including the memory cell of the defective mode, in which the short circuit is established between the control gate and the p-type well formed thereon, can be in the floating state during the batch erasing operation. Therefore, a desired erasing voltage VPPE can be applied to the memory cells, which are included in blocks other than the defective block, without causing the potential drop in the booster circuit for outputting the erasing voltage VPPE.

In addition, since the level of the signal line SGSP is set to be the Vcc level during the batch erasing operation, the select gate lines of all of the blocks are in the floating state regardless of the presence of the defective memory cell. Therefore, even if the oxide film of the select gate transistor connected to the select gate line is defective, the erasing voltage VPPE of the p-type well, on which the memory cells are formed, does not drop.

Then, a batch writing operation subsequently carried out will be described. During the batchwriting operation, the ground potential Vss is given to the p-type well, on which the memory cells are formed. Similar to the above described batch erasing operation, the signals A and /A are set to be in the low and high levels, respectively. Thus, the latch data of the latch circuit 501 is outputted to the node VG. If the latch data is "1", the high level of a higher potential than the writing boosted potential VPPW by the threshold voltage Vth of the NMOS transistor is outputted to the node VG. In addition, if the latch data is "0", the low level of Vss is outputted to the node VG.

During the batch writing operation, the potential of Vppw is supplied to all of the global control gate lines from the booster circuit. Therefore, all of the control gate lines included in the block including the defective memory cell, which has been detected by the above described defective block detecting operation, have a potential of Vss, and all of the control gate lines included in other blocks have a potential of VPPW. In this preferred embodiment, the potential of the booster circuit does not leak via the defective memory cell even during the batch writing operation. Therefore, it is possible to carry out a batch writing test wherein a desired writing potential VPPW is exactly applied to all of the control gates having no defective memory cells.

(Second Preferred Embodiment)

Figure 10:
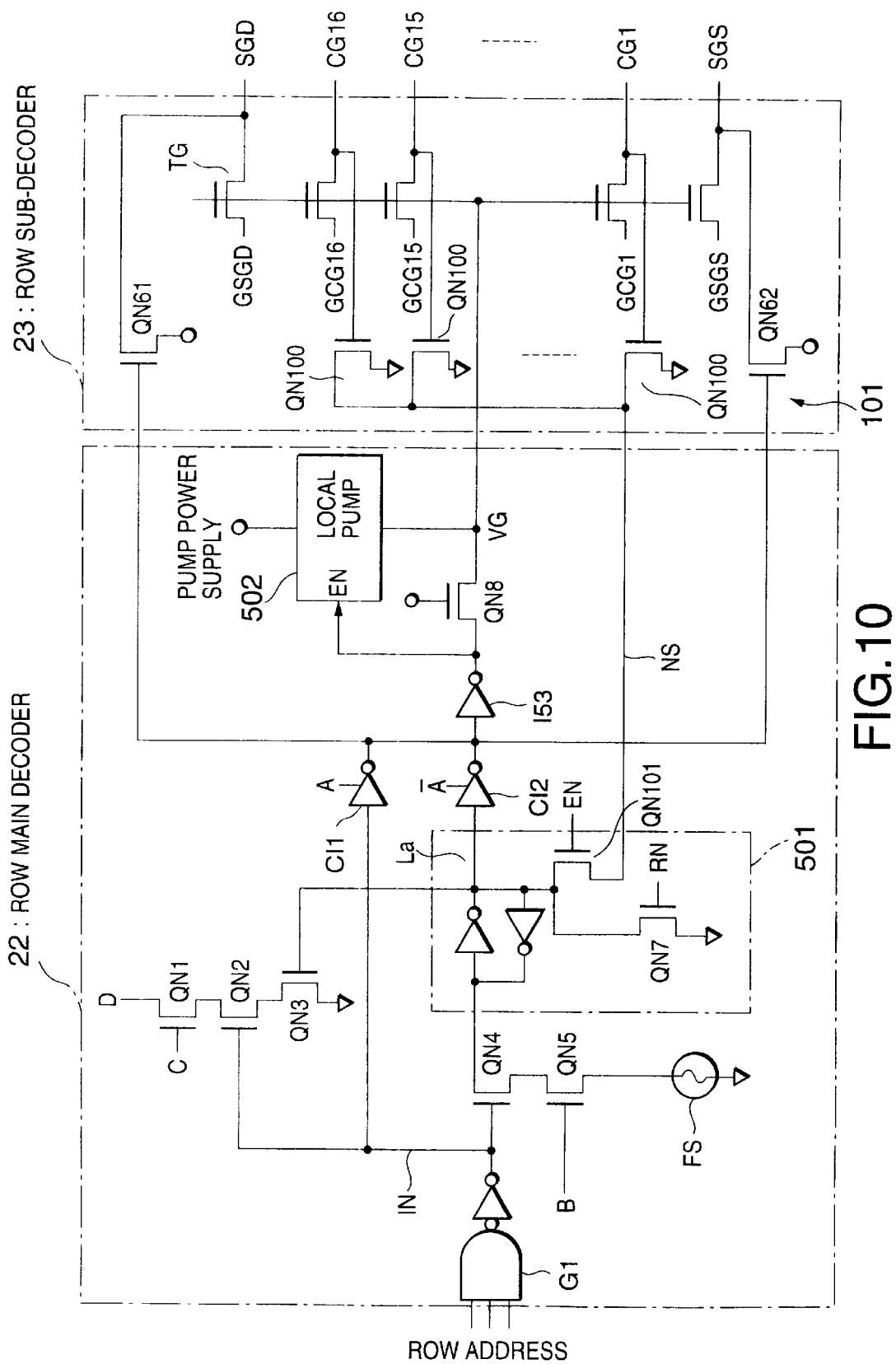
FIG. 10 is a diagram showing the construction of a row decoder of the second preferred embodiment of an EEPROM according to the present invention.

FIG. 10 shows the second preferred embodiment of a row main decoder 22 and a row sub-decoder 23 according to the present invention. In the preceding preferred embodiment, as shown in FIG. 4, the global control gate line potential detecting circuit 41 is provided commonly in all of the blocks of the memory cell array. On the other hand, in this preferred embodiment, the same detecting function is dispersed in each of the row sub-decoders 23 of each block to be provided as a potential detecting circuit 101. Specifically, 16 discharging NMOS transistors QN100 are provided in each of the row sub-decoders 23 as those corresponding to the NMOS transistors QN41 connected to the global control gate lines GCG in FIG. 4. The gates of the discharging NMOS transistors QN100 are connected to control gate lines CG1 through CG16, respectively, and the drains thereof are connected commonly to a sense node NS. The source thereof are grounded. The portion of the discharging transistors QN100 constitutes the potential detecting circuit 101 corresponding to the defective block detecting circuit 10 shown in FIG. 1.

The sense node NS is connected to the latch node La of the latch circuit 501 of each of the row main decoders 22 via a sensing NMOS transistor QN101. A control signal EN enters the gate of the NMOS transistor QN101. That is, when the control signal EN is in H, if any one of the discharging transistors QN100 is turned on, data of the latch circuit 501 are reset.

Since other constructions are the same as those in the preceding preferred embodiment, the same reference numbers are given to corresponding portions, and the detailed description thereof is omitted.

Referring to the timing chart of FIG. 11, a batch erasing/writing operation in this preferred embodiment will be described below. Similar to the preceding preferred embodiment, before carrying out the batch erasing/writing operation, the control circuit in the chip carries out a defective block detecting operation. First, at time t1, all of the row main decoders are multiple-selected. Thus, the node VG of all of the row decoders have a potential of a high level, and the Vss potentials of the global control lines GCG1 through GCG16 are transferred to all of the control gate lines CG1 through CG16. Then, at time t2, the level of the signal line B varies from the low level to the high level, and the output nodes La of the latch circuits 501 in all of the row decoders are set so as to have a high level. At time t3, all of the row decoders are in the unselected state, and the level of the signal line B returns to the low level.

At time t4, the potential of the p-type well, on which the memory cells are formed, is boosted, and all of the row decoders are multi-selected again. At this time, the potential of the signal line SGSP varies from the low level to the high level. Therefore, the select gate lines SGD and SGS are in the floating state, so that the potentials thereof are substantially equal to the boosted potential VPPE by the coupling to the p-type well. Also, at this time, all of the global control lines are set so as to have the Vss potential, so that all of the control gate lines are reset so as to have the Vss potential. At time t5, the level of the signal line EN varies from the low level to the high level, and the sense node NS is electrically connected to the latch node La. Thus, the sense nodes NS of all of the blocks have the same high level as that of the latch node La.

Thereafter, at time t6, all of the row decoders are in the unselected state, and the levels of the nodes VG of all of the blocks vary from the high level to the low level. Therefore, the transfer gate transistors TG in the row sub-decoder 23 are in the non-conducting state, and all of the control gate lines CG1 through CG16 are electrically disengaged from the global control gate lines GCG1 through GCG16 to be in the floating state.

Figure 11:
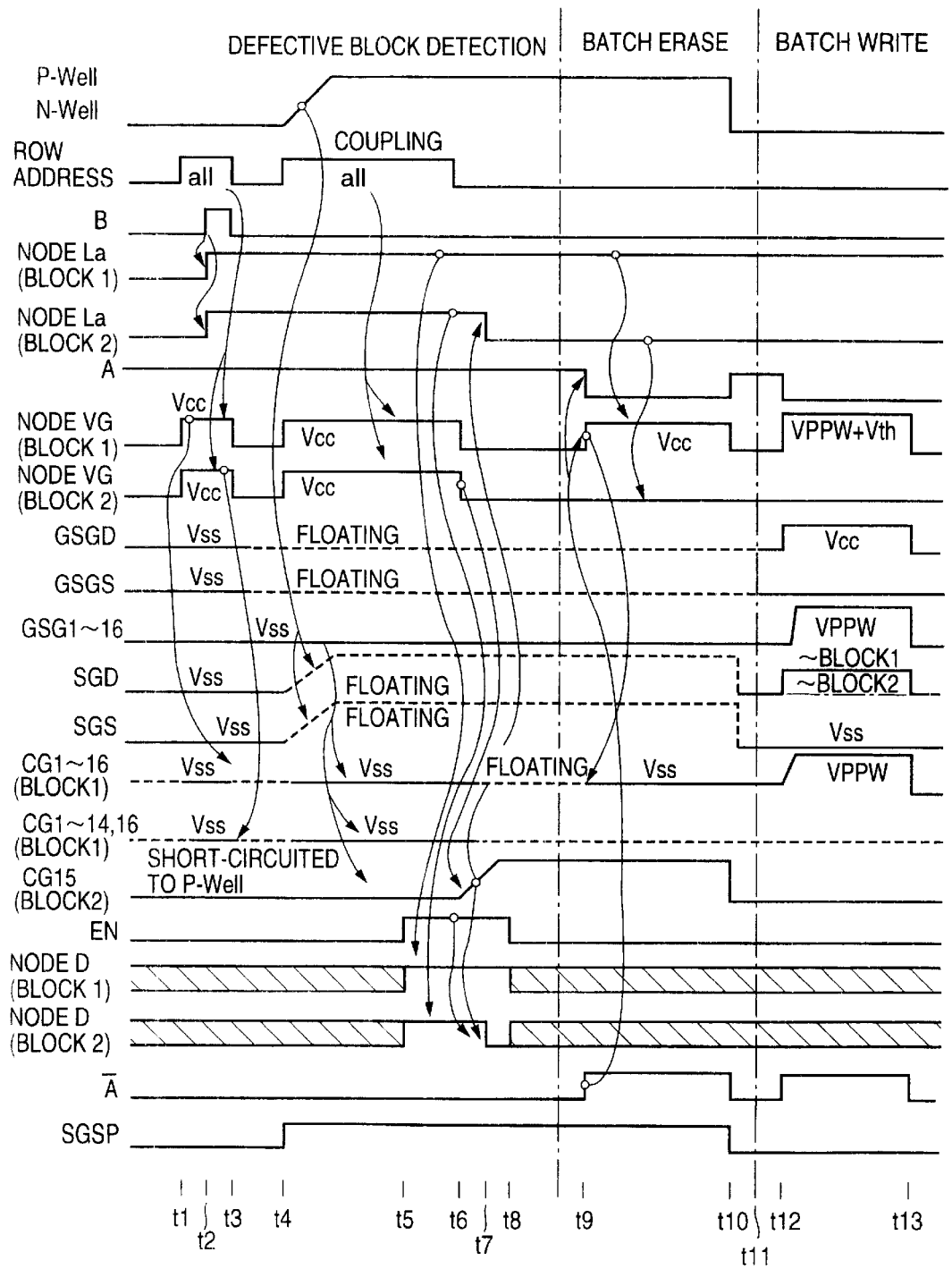
FIG. 11 is a timing chart for explaining a batch writing/ erasing operation in the second preferred embodiment.

FIG. 11 shows an example of a case where a defective memory cell is connected to the control gate line CG15 of the fifteenth page of the second block address. Since the control gate line CG15 of this address is electrically short-circuited to the p-type well, it has the same potential as that of the p-type well. Since other control gate lines are in the floating state, the potentials thereof do not vary from the Vss potential.

If the potential of the control gate line CG15 connected to the defective memory cell is not less than the threshold of the NMOS transistor, the discharging transistor QN100 connected to the control gate line CG15 is in the conducting state, so that the sense node NS has the Vss potential. As a result, the potential of the latch node La of the row main decoder part for driving the control gate line CG15 connected to the defective memory cell varies from the high level to the low level, so that the latch data varies from "1" data to "0" data.

At time t8, the level of the signal line EN varies from the high level to the low level, and the defective block detecting operation is completed. Thus, in this preferred embodiment, it is possible to simultaneously set data in the latch circuits

501 of all of the row main decoders 22, unlike the preceding preferred embodiment wherein the block address connected to the defective memory cell is detected while incrementing the row address, to set data in the latch circuit 501 of a hit row main decoder 22. Therefore, this preferred embodiment has the merit of shortening the time required to carry out the defective block detection prior to the batch erasing/writing operation. The batch erasing/writing operation subsequently carried out is the same as that in the above described preferred embodiment.

(Third Preferred Embodiment)

Figure 12:
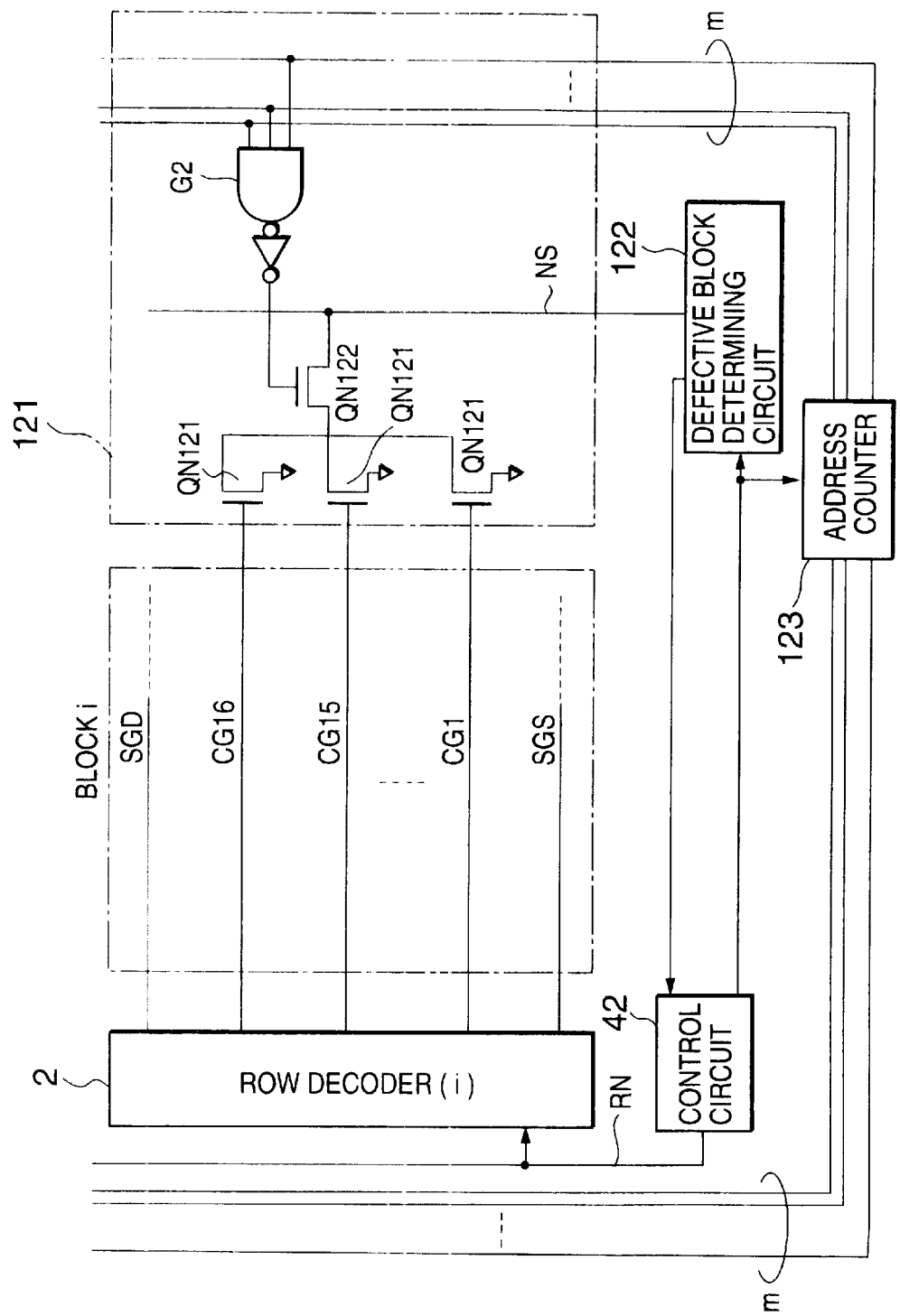
FIG. 12 is a diagram showing the construction of a control gate line potential detecting circuit of the third preferred embodiment of an EEPROM according to the present invention.

FIG. 12 shows the third preferred embodiment of a circuit according to the present invention, as a modification of the second preferred embodiment, with respect to a block i of a memory cell array. In this preferred embodiment, discharging NMOS transistors QN121 corresponding to the discharging NMOS transistors QN100 in the preceding second preferred embodiment are arranged on the termination portions of the control gate lines CG1 through CG15 on the opposite side to the arrangement of the row decoder 2 of the block i. A control gate line potential detecting circuit 121 comprises the discharging NMOS transistors QN121, a sensing NMOS transistor QN122 and a row address decoding NAND gate G2.

The gates of the discharging NMOS transistors QN121 are connected to the control gate lines CG1 through CG15, the sources thereof are grounded, and the drains thereof are connected commonly to one end of the sensing NMOS transistor QN122. The other end of the sensing NMOS transistor QN122 is connected to a defective block determining circuit 122 via a sense node NS. The control gate line potential detecting circuit 121 provided in each block and the defective block determining circuit 122 correspond to the defective block detecting circuit 10 of FIG. 1.

The test control circuit 42 outputs an address increment control signal, so that an address counter 123 outputs a row address, which is sequentially updated, to carry out a defective block detection. The sense node NG has been preset to a high level.

The output of a NAND gate G2 has L at the address of the corresponding address, so that the sensing NMOS transistor QN122 is turned on. At this time, similar to the preceding preferred embodiment, if one of the control gate lines CG1 through CG16 is defective to have a high potential by the potential of the p-type well, the discharging NMOS transistor QN121 is turned on, and the sense node NS is discharged via the sensing NMOS transistor QN122. This is detected by the defective block detecting circuit 122, and data indicative of the defective block are set in the latch circuit in the row decoder via the control circuit 42. The construction of the latch circuit in the row decoder 2 may be the same as that in the first preferred embodiment shown in FIG. 5.

(Fourth Preferred Embodiment)

The preferred embodiment of an AND type EEPROM according to the present invention will be described below.

Figures 13, 14:
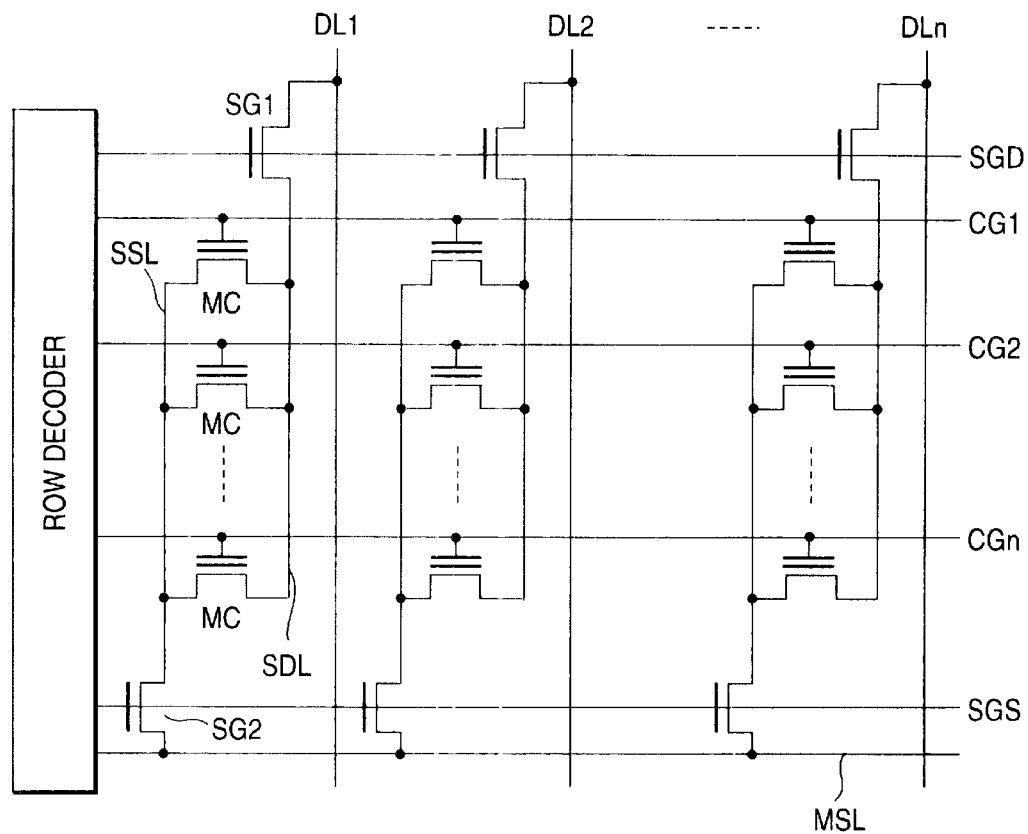
FIG. 13 is a diagram showing the construction of a memory cell array of the fourth preferred embodiment of an AND type EEPROM according to the present invention.
FIG. 14 is a table showing the relationship between the potentials of respective parts during the operation of the EEPROM.

FIG. 13 shows the construction of a memory cell array of an AND type EEPROM.

In the AND type EEPROM, a basic unit comprises an AND unit wherein a plurality of floating gate type nonvolatile memory cells MC are provided between a sub-data line SDL and a sub-source line SSL. The AND unit includes a drain-side select gate transistor SG1, which is provided as a switch between the sub-data line SDL and a main data line DL, and a source-side select gate transistor SG2 which is provided as a switch between the sub-source line SSL and a main source line MSL.

FIG. 14 shows the relationship between the potentials of respective parts in a writing/erasing operation for this EEPROM. A writing operation is carried out by applying a positive high voltage VPPW to a control gate to inject electrons into a floating gate. An erasing operation is carried out by applying a negative high voltage VPPE to the control gate to extract electrons from the floating gate into the substrate. A plurality of AND units selected by common select gate lines SGD and SGS constitute one block. It is different from the NAND type EEPROM that the erasing operation is executed every control gate line, not every block, and that the erasing operation is carried out by applying the negative potential during erasing operation.

However, if there is a memory cell, in which a short circuit is electrically established between the control gate and the substrate, the positive boosted potential VPPW for a batch writing operation and the negative boosted potential VPPE for a batch erasing operation can not be outputted, so that the writing and erasing operations for other memory cells can not be carried out in a predetermined period of time similar to the NAND type EEPROM. If a memory cell connected to a certain control gate line is defective, the whole block is replaced with a redundant circuit which is provided in the chip. In this case, the replacement in row directions is carried out at block level.

Figure 15:
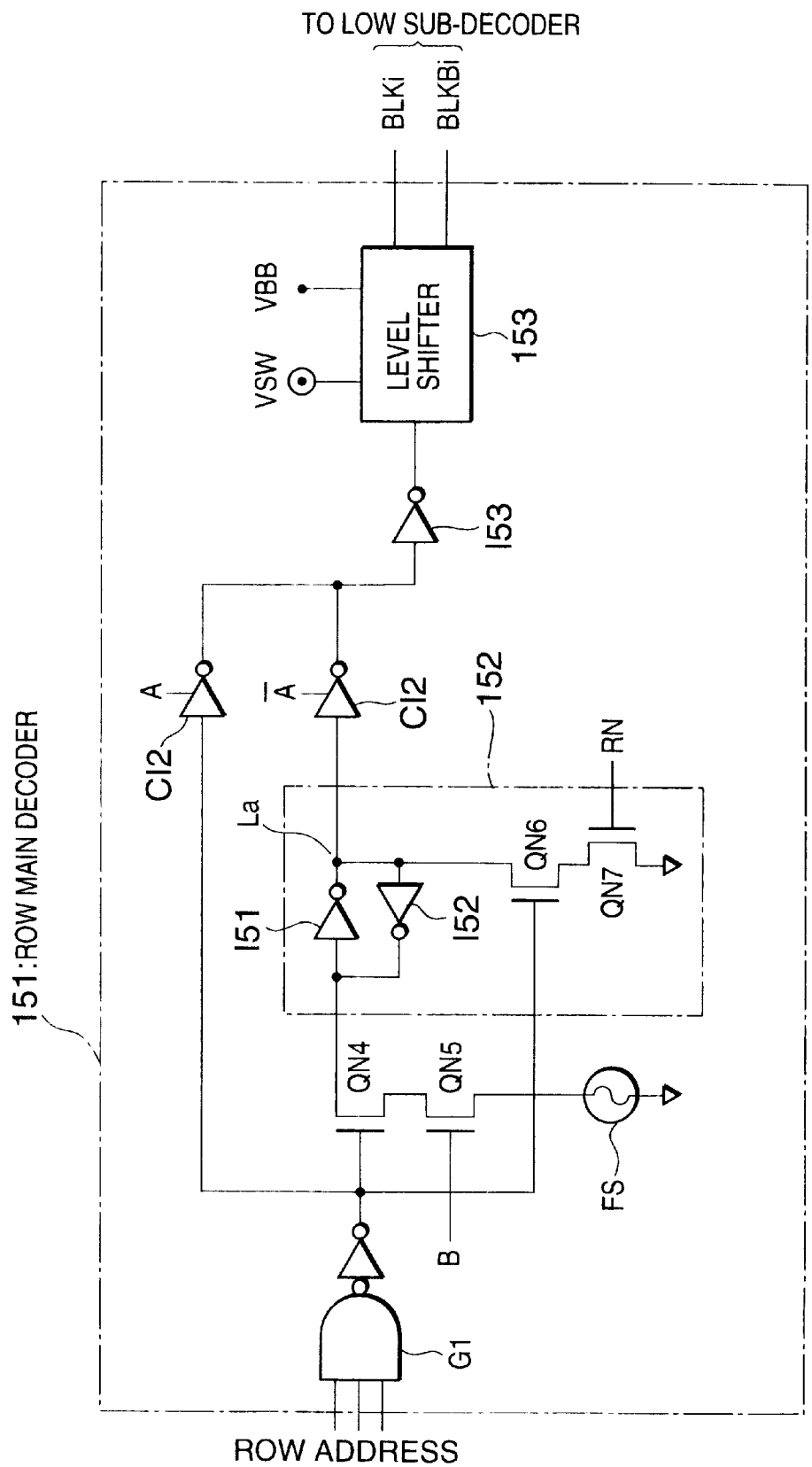
FIG. 15 is a diagram showing the construction of a row main decoder in the fourth preferred embodiment.

FIG. 15 is a circuit diagram of a row main decoder 151 in this preferred embodiment. The same reference numbers are given to portions corresponding to those of the row main decoder 22 of FIG. 5 in the first preferred embodiment. The row main decoder 151 includes an input part using an NAND gate G1 for decoding a row main address signal, a latch circuit 152 for storing defective block information, and a level shifter 153 for converting the voltage level of an output signal of the input part or an output signal of the latch circuit 152. Similar to the NAND type EEPROM, DNS transistors QN6 and QN7 are connected in series between the output node La and Vss of the latch circuit 152, in order to set latch data to be "0" when a defective memory cell is detected. An aggregation of the plurality of latch circuits 152 constitutes the defective block storing circuit 2a in the FIG. 1.

A signal RN is supplied to the gate of the transistor QN7. During the defective block detecting operation, this signal has a high level in the same timing as that in the first preferred embodiment. In addition, a decode output signal is supplied to the gate of the transistor QN4, and only the transistor QN4 in the row main decoder corresponding to the block address selected by the test control circuit is in a conducting state. The latch circuit 152 comprises two inverters I51 and I52, and the output signal thereof is transmitted to the level shifter 153 via a clocked buffer CI2, to which an enable signal /A has been inputted. This signal /A has a high level only during the defective block detecting operation and during the subsequent batch writing/erasing operation, so that the output of the latch circuit is enable. During other usual operations, the clocked inverter CI2 is disable, and in place of this, a clocked inverter CI1, to which an enable signal A has been inputted, is enable. Therefore, during a usual operation, a decode output signal is transmitted to the level shifter 153 via the clocked inverter CI1.

In the fourth preferred embodiment similar to the first preferred embodiment, the address information of the block connected to the defective memory cell is previously stored in the latch circuit 152 during the batch writing/erasing operation. Thus, during the batch writing/erasing operation, it is possible to inhibit a positive or negative boosted voltage from being supplied to the control gate in the defective block. The output level of the output signal of the latch circuit 152 is converted by the level shifter 153, and the converted signal is outputted as a selection signal BLKi of a row sub-decoder and an inverted signal BLKBi.

Figure 16:
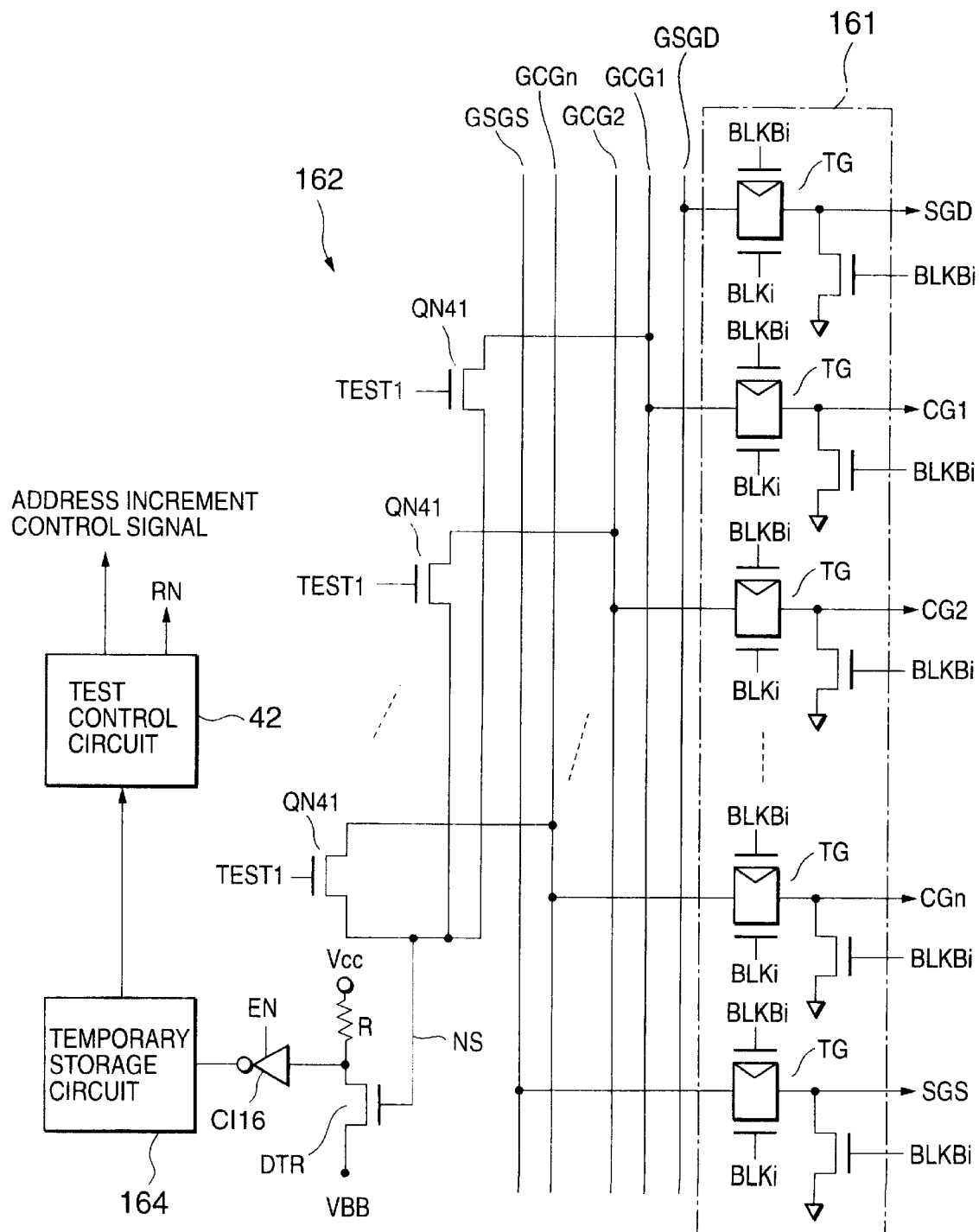
FIG. 16 is a diagram showing the construction of a row sub-decoder and a global control gate line potential detecting circuit in the fourth preferred embodiment.

FIG. 16 shows the construction of a row sub-decoder 161. The row sub-decoder 161 has substantially the same basic construction as that of the row sub-decoder in the first preferred embodiment shown in FIG. 6. During an erasing operation, a high power supply voltage VSW is 0V, and a low power supply voltage VBB of the row main decoder 151 is a negative potential VPPE. Thus, the level of the signal BLKi of the selected block is a high potential of 0 V, and the level of its inverted signal BLKBi is the level of the negative power supply voltage VPPE. During the erasing operation, the level shifter 153 and the p-type well of the NMOS transistor of the transfer gate TG of the row sub-decoder 161 are set to be in the low potential VPPE, and the potential of the n-type well of the PMOS transistor is set to be 0 V which is a high power supply voltage. As a result, the transfer gate TG is in the conducting state, and in the selected block, the potentials of the global control lines GCG and global select gate lines GSGD and GSGS are transferred to the control gate line GC and select gate lines SGD and SGS, respectively. In unselected blocks, the relationship between the potentials of the selection signal BLKi and its inverted signal BLKBi is reversed, and the transfer gate TG is in the non-conducting state, so that the select gate lines SGD and SGS and control gate line CG have a level of Vss.

During a writing operation, the power supply voltage VSW is a positive high potential VPPW, and the power supply voltage VBB is 0 V. Thus, the level of the signal BLKi of the selected block is the high potential VPPW, and the level of its inverted signal BLKBi is the minimum potential of 0 V. As a result, the potentials of the corresponding global control gate lines GCG and global select gate lines GSGD and GSGS are transferred to the control gate line CG and select gate lines SGD and SGS of the writing block. In addition, in the unselected blocks, the select gate lines SGD and SGS and the control gate line CG are grounded.

Figure 17:
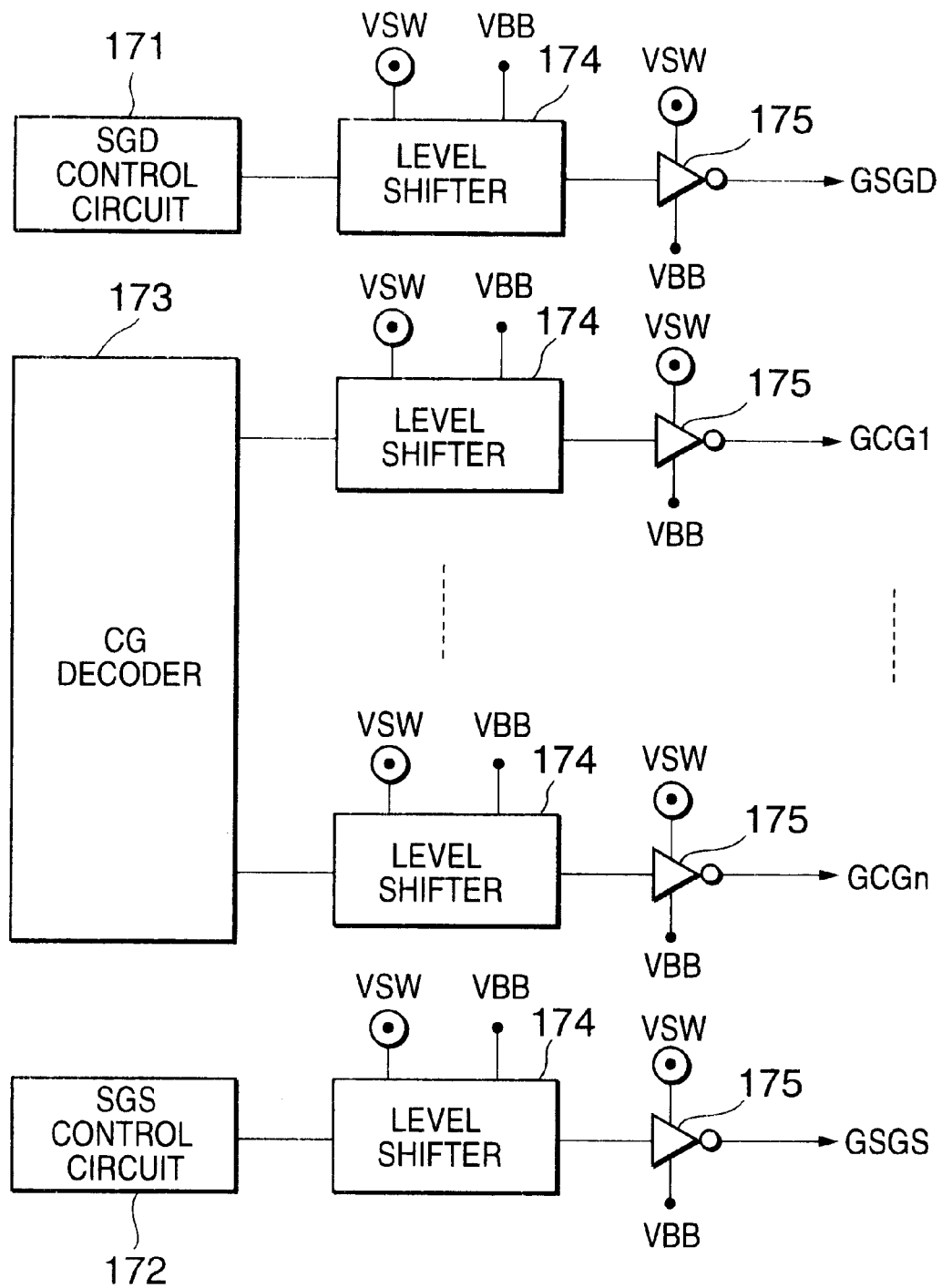
FIG. 17 is a diagram showing the construction of a global control gate line potential generating circuit in the fourth preferred embodiment.
Figures 18A, 18B:
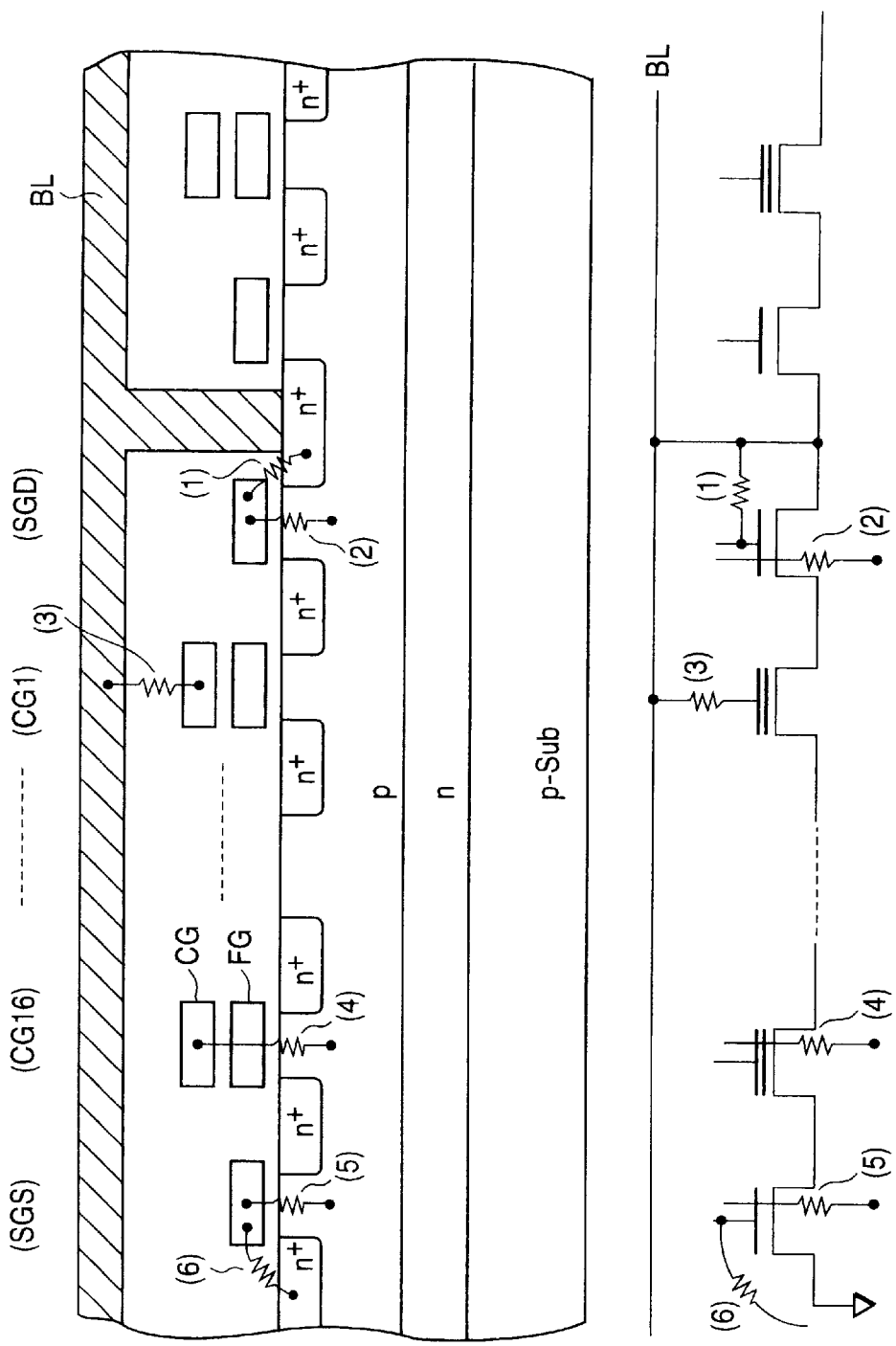
FIGS. 18A and 18B are diagrams showing defective modes of a NAND type EEPROM cell.

The voltages supplied to the above described global control gate line GCG and global select gate lines GSGD and GSGS are generated by a circuit shown in FIG. 17. That is, the Vcc voltages generated by an SGD logical circuit 171, an SGS logical circuit 172 and a select gate decode circuit 173, which correspond to the respective signal lines, are converted into appropriate voltages for the erasing/writing operation, by means of level shifters 174 and level converting buffers 175.

As shown in FIG. 16, a global control gate line potential detecting circuit 162, having the same construction as that in the first preferred embodiment, is provided against the global control gate lines GCG. The NMOS transistor QN41, one end of which is connected to each of the global control gate lines GCG, is a high voltage transistor which is resistant to a high voltage. The other end of the NMOS transistor QN41 is connected commonly to a sense node NS. To the gates of the respective transistors, a test signal Test1 is supplied.

The drain of a sensing NMOS transistor DTR, the gate of which is connected to the sense node NS, is connected to a power supply Vcc via a resister R, and the source thereof is grounded. The drain output of the sensing transistor DTR is transferred to a temporary storage circuit 164 of a latch circuit or the like via a clocked buffer CI16, to which an enable signal is inputted, to be stored therein. The control of the test operation carried out by a test control circuit 42 on the basis of the data held by the temporary storage circuit 164 is basically the same as that in the first preferred embodiment.

In this preferred embodiment, a negative voltage VPPE is supplied to the control line CG to check whether a defective memory cell exists in a selected block. This method will be described below. First, a negative voltage is supplied to a global control lines GCG, and the potential of the control gate lines CG in a selected block is set to be a negative potential. Thereafter, the supply of the negative potential to the global control lines GCG is stopped. If a defective memory cell exists, the potential of one or more global control lines GCG corresponding it rises from the negative high potential to 0 V. If no defective memory cell exists, this negative high potential is held. This variation in potential is detected by the potential detecting circuit 162. In the block address wherein the defective address has been detected, information of a level indicating that the block is unselected is stored in the temporary storage circuit 164.

The test signal Test1 has a voltage of 0 V during a usual writing/reading operation and during a batch writing operation, and a negative minimum voltage VBB during erasing and batch erasing operations. In addition, the test signal Test1 has a voltage of VBB, which is in a disable state, at the beginning of the defective block detecting operation, and a voltage of 0 V, which is in an enable state, during a defective block detecting operation, which is a process before a batch erasing/writing operation, similar to the first preferred embodiment. Thus, the above described variation in potential of the global control line GCG is transferred to the gate of the sensing transistor DTR. The source of the sensing transistor is VBB. During the defective block detecting operation, the level of the negative potential of the global control line GCG read out via the transistor QN41 is converted by the sensing transistor DTR, and the converted potential is read out by the clocked inverter CI16 in the next stage. If no defective memory cell exists in the selected block address, the potential of the global control line CG remains being in the VPPE level, and the sensing transistor DTR, to the source of which the VBB is supplied, is in a non-conducting state. Therefore, the drain node of the sensing transistor DTR has a power supply voltage Vcc.

If a defective memory cell exists in the selected block address, the potential of the global control line CG has a higher level than that of the negative high voltage VPPE, so that the sensing transistor DTR is a conducting state. At this time, if the value of the resister R provided between the drain and the power supply terminal is set to be sufficiently great, the level of the drain node of the sensing transistor DTR falls approximately to the VBB. These high and low levels are detected by the clocked inverter CI16, and the result thereof is stored in the temporary storage circuit 164. This clocked inverter CI16 is set to be enable by an enable signal EN during the defective block detection, but to be disable during a usual operation.

Similar to the NAND type EEPROM in the first preferred embodiment, if the result of the temporary storage circuit 164 indicates that the defective memory cell exists in the selected block, the signal RN is outputted from the test control circuit 42. Therefore, "0" data are set only in the latch circuit in the row main decoder of the selected block address. The test control circuit 42 carries out the above described defective block detecting operation while automatically incrementing the block address from the first block address to the final block address. Thus, "0" data are stored only in the block, in which the defective memory cell exists, and thereafter, a batch writing/erasing operation is carried out. Thus, the boosted voltage does not leak via the defective memory cell, so that it is possible to apply a normal voltage to the memory cell of a normal block address.

Figure 20:
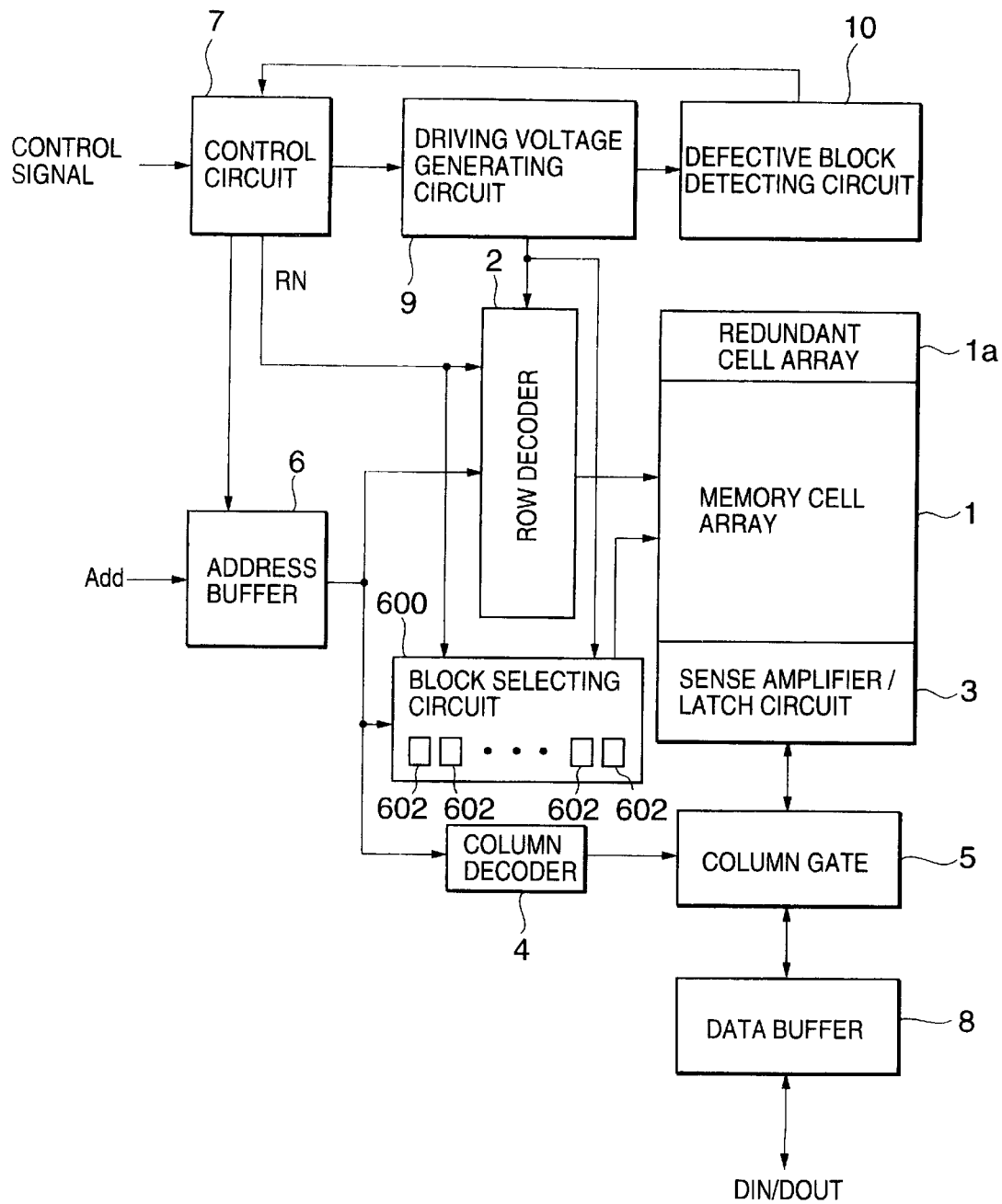
FIG. 20 is showing another type EEPROM having a block selecting circuit separated from a row decoder.

In each of the above-mentioned preferred embodiments, the defective block storing circuit 2a for storing information on defective blocks is provided in the row decoder 2. That is, the case where a block selecting circuit for selecting a block among the blocks is row decoder 2 has been explained. However, as shown in FIG. 20, this invention may apply to any EEPROM of the type that a block selecting circuit 600 for selecting a block among the blocks is provided as a peripheral circuit other than the row decoder 2. In this case, the block selecting circuit 600 has a plurality of block selecting information storing circuits 602. Moreover, one block is an inclusive unit including a plurality of writing units. After the data in all the block selecting information storing circuits 602 are set in the enable status, the data in the block selecting information storing circuit 602 corresponding to the defective block is set in the disable status on the basis of the detected result of the defective block detecting circuit 10. Then, by selecting the memory cells on the basis of the data in each of the block selecting information circuits 602, all of the memory cells in the blocks other than the defective block(s) can be supplied with a given high voltage stress.

In addition, the defective block information stored in the defective block storing circuit 2a (the latch circuits 501) according to this invention may be read out by using the erase selecting address retrieving circuit 503 in FIG. 5. The signal supplied to each terminal D is set at the high level, and the signal C is also set at the high level. Then, the control circuit 7 monitors the level of each terminal D while incrementing the row addresses sequentially. The level of the terminal D is held at the high level when the latch circuit 501 holding the information indicating the defective block is selected, whereas the level of the terminal D is changed to the low level when the latch circuit 501 holding the information indicating the normal block is selected. By causing the memory cell array 1, for example, to automatically store only block address information indicating that the level of the terminal D is held at the high level, it is possible to read out this information later.

Furthermore, by using the defective block detecting circuit 10 in the preferred embodiments, it is easy to realize adding a test mode to read out the defective block address information stored in the blocks to an outside source. The blocks are selected on the basis of the external address inputted from outside.

Figure 19:
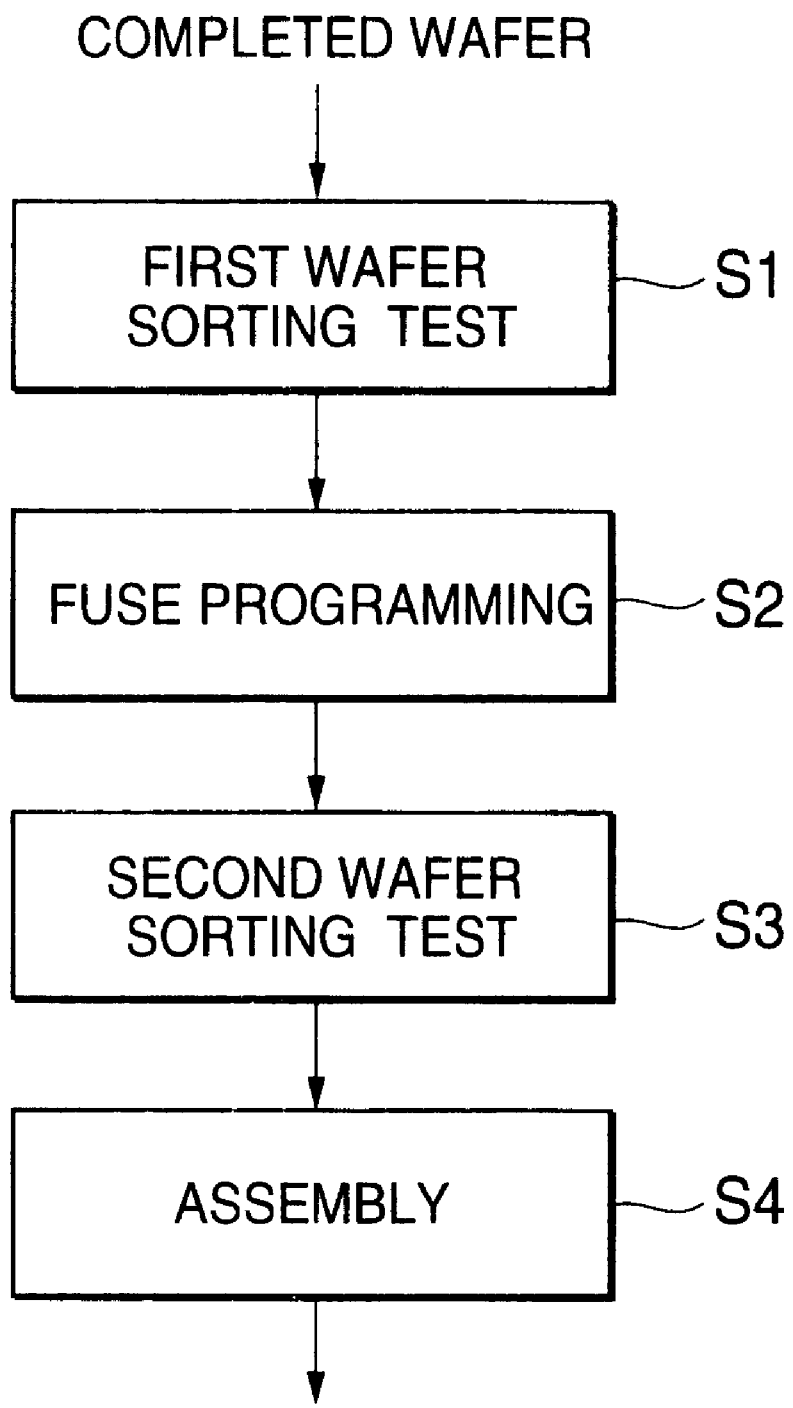
FIG. 19 is a flow chart showing a test process until assembly after a wafer of a usual EEPROM is completed.

As described above, according to the present invention, it is possible to carry out a writing/erasing operation in all of memory cells in a chip without replacing the address of a defective memory with a redundant part. Therefore, a writing/erasing stress can be applied to memory cells during a first wafer sorting test (the step S1 in FIG. 19), and an initial defective block and a block, which is defective after a writing/erasing test, can be simultaneously replaced with blocks in the redundant part. In addition, since no stress is applied to a defective bit during a writing/erasing stress test, the boosted voltage does not drop, so that it is possible to raise the reliability of the writing/erasing stress test.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A nonvolatile semiconductor memory device comprising:
   a memory cell array, in which nonvolatile memory cells capable of being electrically rewritable are arranged;
   a decode circuit for selecting a memory cell of said memory cell array;
   a sense amplifier circuit for sensing read data of said memory cell array and for latching written data to said memory cell array;
   a driving voltage generating circuit for generating a boosted driving voltage in accordance with write and erase modes;
   a defective block detecting circuit for detecting a block including a defective memory cell of said memory cell array by detecting a potential of at least one signal line which is driven by said driving voltage generated by said driving voltage generating circuit; and
   a test control circuit for controlling a batch erasing test every batch erasing operation unit in said memory cell array and/or a batch writing test every writing operation unit in said memory cell array, and for stopping of the supply of said driving voltage to said defective memory cell during said batch erasing test and/or said batch writing test on the basis of a detected result of said defective block detecting circuit.

2. A nonvolatile semiconductor memory device as set forth in claim 1, wherein said defective block detecting circuit is activated at the beginning of a control sequence of the batch writing test or the batch erasing test by said test control circuit.

3. A nonvolatile semiconductor memory device as set forth in claim 2, wherein said test control circuit generates an address increment control signal sequentially in said control sequence of the batch writing test or the batch erasing test, the address increment control signal incrementing the block to be selected, and causes said decode circuit to store the detected result of said defective block detecting circuit as defective information sequentially.

4. A nonvolatile semiconductor memory device as set forth in claim 1, wherein said decode circuit has a row decoder for selectively driving at least one word line of said memory cell array, and a column decoder for selecting at least one bit line of said memory cell array, and
   a detected result of said defective block detecting circuit is held in a latch circuit in said row decoder as defective information.

5. A nonvolatile semiconductor memory device as set forth in claim 4, wherein said row decoder has row main decoders provided for each block of said memory cell array to select a block, and row sub-decoders provided for each block and controlled by an output of said row main decoder to transfer said driving voltage, which is generated by said driving voltage generating circuit, to word lines in a selected block, and
   said defective block detecting circuit has potential detecting circuits for detecting the variation in potential of the signal line before said driving voltage generated by said driving voltage generating circuit is distributed to said row sub-decoders.

6. A nonvolatile semiconductor memory device as set forth in claim 4, wherein said row decoder has row main decoders provided for each block of said memory cell array to select a block, and row sub-decoders provided for each block and controlled by an output of said row main decoder to transfer said driving voltage, which is generated by said driving voltage generating circuit, to word lines in a selected block, said defective block detecting circuit has potential detecting circuits, which are provided in each said row sub-decoder of said memory array, for detecting the variation in potential of the word lines in each block, and each output of said potential detecting circuits being held in each latch circuit of each said row main decoder as the defective information.

7. A nonvolatile semiconductor memory device as set forth in claim 1, wherein said defective block detecting circuit has potential detecting circuits, arranged in each block of said memory cell array opposite to said row decoder, for detecting the potential of word lines of each block.

8. A nonvolatile semiconductor memory device as set forth in claim 7, wherein said decode circuit has a row decoder for selectively driving at least one word line of said memory cell array, and a column decoder for selecting at least one bit line of said memory cell array, and each output of the potential detecting circuits is held in each of latch circuits in said row decoder as the defective information.

9. A nonvolatile semiconductor memory device as set forth in claim 1, wherein said decode circuit has a row decoder for selectively driving at least one control gate line of said memory cell array, and the detected result of the defective block detecting circuit is held in a latch circuit in said row decoder as defective information.

10. A nonvolatile semiconductor memory device as set forth in claim 9, wherein said defective block detecting circuit has a potential detecting circuit for detecting the variation in potential of global control gate lines before said driving voltage generated by said driving voltage generating circuit is distributed to control gate lines of each block.

11. A nonvolatile semiconductor memory device as set forth in claim 1, wherein said decode circuit has a block selecting circuit for selecting a block among blocks, the block being a plurality of writing units, and a detected result of said defective block detecting circuit is held in a latch circuit in said block selecting circuit as defective information.

12. A nonvolatile semiconductor memory device comprising:

a memory cell array, in which nonvolatile memory cells capable of being electrically rewritable are arranged;

a decode circuit for selecting a memory cell of said memory cell array;

a sense amplifier circuit for sensing read data of said memory cell array and for latching written data to said memory cell array;

a driving voltage generating circuit for generating a boosted driving voltage in accordance with write and erase modes;

a defective block detecting circuit for detecting a block including a defective memory cell of said memory cell array by detecting a potential of at least one signal line which is driven by said driving voltage generated by said driving voltage generating circuit;

a test control circuit for storing a detected result of said defective block detecting circuit to a storing circuit of a corresponding one of blocks; and a reading out circuit for reading out the detected result from said storing circuit to an outside source.

13. A nonvolatile semiconductor memory device comprising:

a memory cell array, in which nonvolatile memory cells capable of being electrically rewritable are arranged;

a decode circuit for selecting a memory cell of said memory cell array;

a sense amplifier circuit for sensing read data of said memory cell array and for latching written data to said memory cell array;

a driving voltage generating circuit for generating a boosted driving voltage in accordance with write and erase modes;

a defective block detecting circuit for detecting a block including a defective memory cell of said memory cell array by detecting a potential of at least one signal line which is driven by said driving voltage generated by said driving voltage generating circuit;

a first control circuit for storing a detected result of said defective block detecting circuit to a storing circuit of a corresponding one of blocks; and a second control circuit for storing the detected result from the storing circuit to said memory cell array.

* * * * *